United States Patent
Atsumi et al.

(10) Patent No.: US 9,536,627 B2
(45) Date of Patent: Jan. 3, 2017

(54) TEST METHOD OF SEMICONDUCTOR DEVICE

(71) Applicant: Semiconductor Energy Laboratory Co., Ltd., Atsugi-shi, Kanagawa-ken (JP)

(72) Inventors: Tomoaki Atsumi, Kanagawa (JP); Shuhei Nagatsuka, Kanagawa (JP); Kazuaki Ohshima, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/082,431

(22) Filed: Mar. 28, 2016

(65) Prior Publication Data

US 2016/0293276 A1    Oct. 6, 2016

(30) Foreign Application Priority Data

Mar. 30, 2015  (JP) ................................. 2015-068921

(51) Int. Cl.
| | |
|---|---|
| *G11C 11/00* | (2006.01) |
| *G11C 11/24* | (2006.01) |
| *G11C 29/50* | (2006.01) |
| *G11C 11/22* | (2006.01) |

(52) U.S. Cl.
CPC ..... *G11C 29/50004* (2013.01); *G11C 11/2273* (2013.01); *G11C 11/2275* (2013.01); *G11C 29/50016* (2013.01)

(58) Field of Classification Search
CPC ............... G11C 11/405; G11C 11/4097; G11C 2211/4013; G11C 7/18; G11C 17/00; G11C 17/18; G11C 13/0061; G11C 11/1693; G11C 11/24

See application file for complete search history.

(56) References Cited

U.S. PATENT DOCUMENTS

| | | | |
|---|---|---|---|
| 7,933,141 B2* | 4/2011 | Kajigaya ................ | G11C 5/147 365/149 |
| 8,339,828 B2 | 12/2012 | Yamazaki et al. | |
| 8,358,530 B2 | 1/2013 | Kamata | |
| 8,363,452 B2 | 1/2013 | Yamazaki et al. | |
| 8,411,480 B2 | 4/2013 | Nagatsuka et al. | |

(Continued)

FOREIGN PATENT DOCUMENTS

JP    2012-089224 A    5/2012

*Primary Examiner* — Hien Nguyen
(74) *Attorney, Agent, or Firm* — Fish & Richardson P.C.

(57) ABSTRACT

The semiconductor device includes a bit line, a transistor, a retention node, and a capacitor. The transistor has a function of charging or discharging the retention node. The capacitor has a function of retaining a potential of the retention node. A voltage greater than the sum of a writing voltage and a threshold voltage is applied to a gate of the transistor. When the transistor is turned on, a first potential is supplied to the bit line with a reference potential in a floating state. A voltage less than the sum of the writing voltage and the threshold voltage is applied to the gate of the transistor. When the transistor is turned on, a second potential is supplied to the bit line with a reference potential in a floating state. With use of the first and second potentials, the threshold voltage of the transistor is calculated without being influenced by parasitic capacitance and variations in the storage capacitance of the capacitor.

8 Claims, 31 Drawing Sheets

(56) References Cited

U.S. PATENT DOCUMENTS

| | | | |
|---|---|---|---|
| 8,520,426 B2 | 8/2013 | Ohnuki | |
| 8,542,528 B2 | 9/2013 | Sekine et al. | |
| 8,569,753 B2 | 10/2013 | Isobe et al. | |
| 8,614,916 B2 | 12/2013 | Nagatsuka et al. | |
| 8,638,589 B2* | 1/2014 | Lu | G11C 16/10 257/317 |
| 8,686,415 B2 | 4/2014 | Kamata | |
| 8,767,443 B2* | 7/2014 | Saito | G11C 11/404 365/149 |
| 8,792,284 B2 | 7/2014 | Ohnuki | |
| 8,848,464 B2 | 9/2014 | Sekine et al. | |
| 8,922,236 B2 | 12/2014 | Saito | |
| 9,171,630 B2 | 10/2015 | Nagatsuka et al. | |
| 9,240,244 B2 | 1/2016 | Nagatsuka et al. | |
| 2006/0227648 A1* | 10/2006 | Kameshiro | G11C 7/18 365/230.05 |
| 2016/0232968 A1* | 8/2016 | August | G11C 11/1693 |

* cited by examiner

| S3-1; reading potential $V_{WBL1}$ and potential $V_{WBL2}$ from demory device 503 |

↓

| S3-2; calculating $V_{th}$ by digital signal processor 502 |

220

230

240

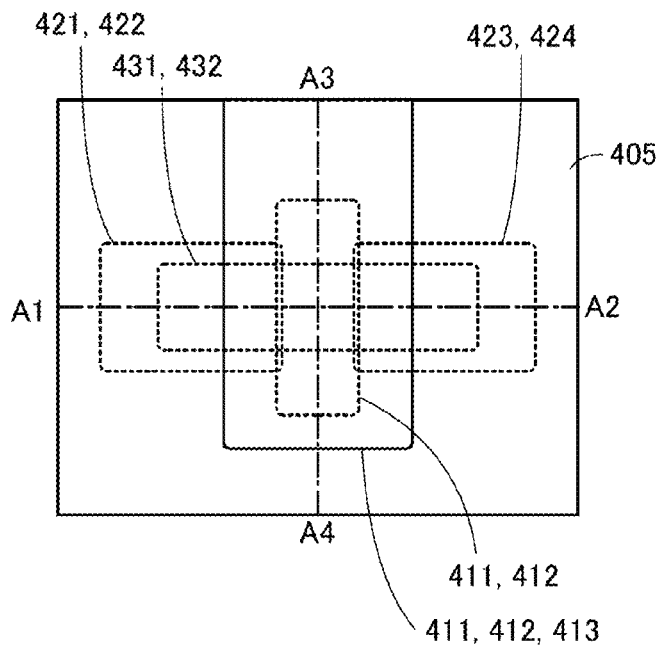
FIG. 12A
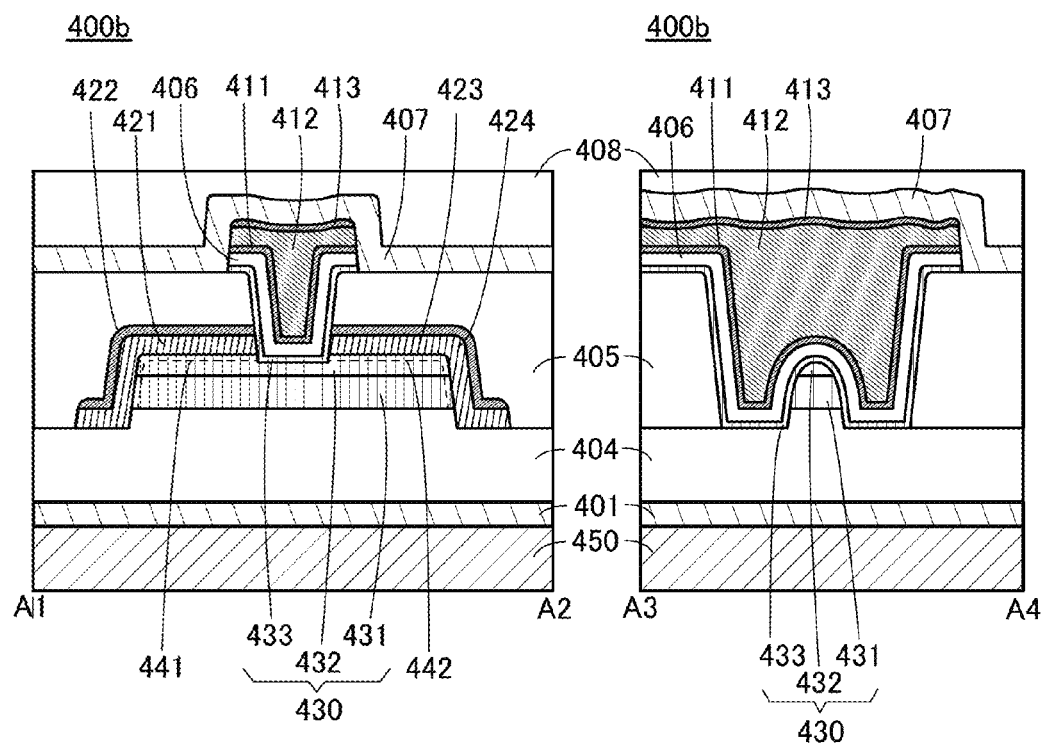
FIG. 12B
FIG. 12C

FIG. 18A
FIG. 18B
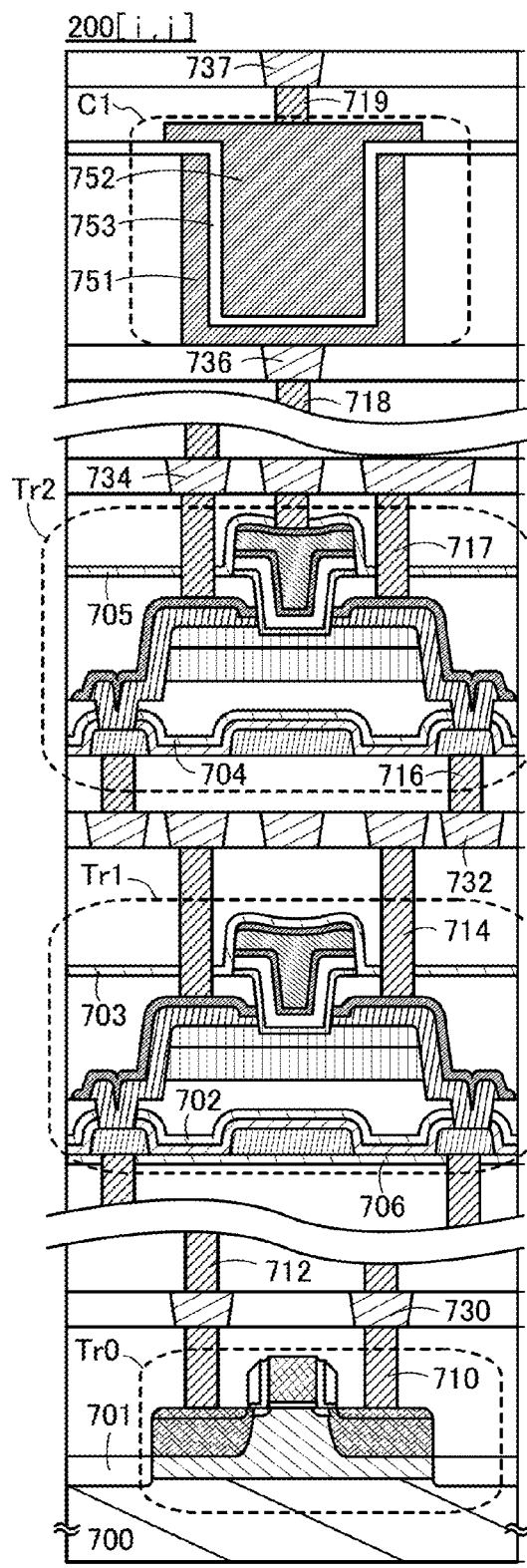
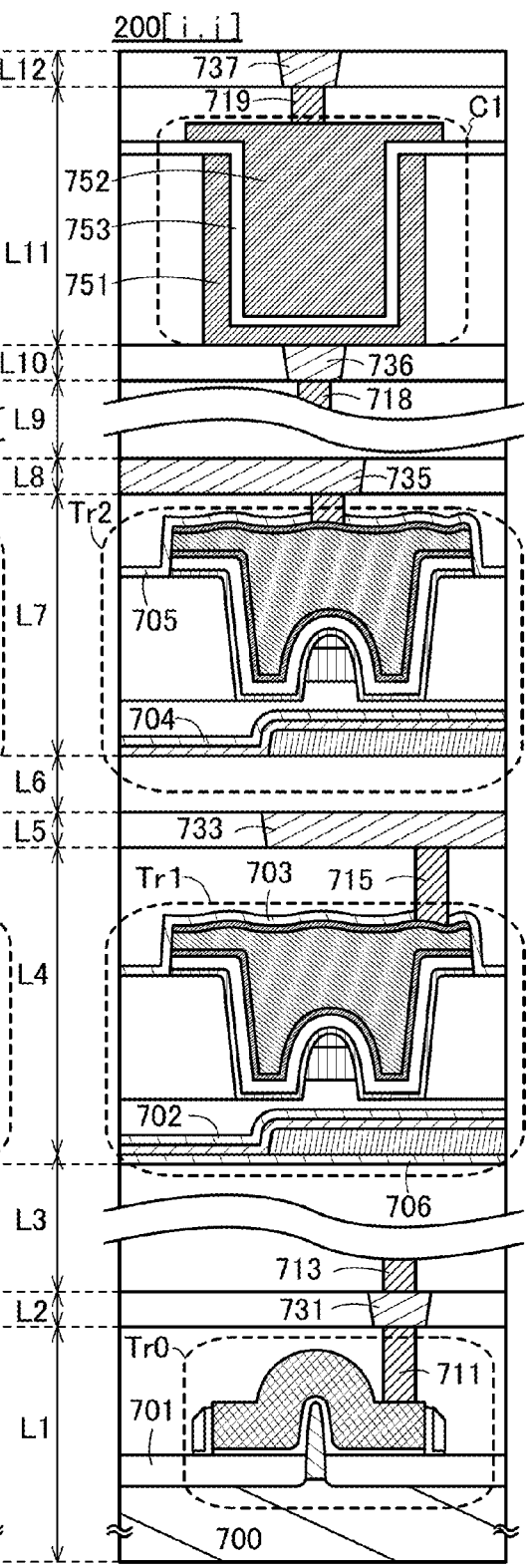

Tr0

Tr0

4000

4000

4000

4000

4000

4000

TEST METHOD OF SEMICONDUCTOR DEVICE

BACKGROUND OF THE INVENTION

1. Field of the Invention

One embodiment of the present invention relates to a test method of a semiconductor device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

2. Description of the Related Art

In the case where a two-transistor and one capacitor gain-cell memory device, a three-transistor and one capacitor gain-cell memory device, or a memory device using a dynamic random access memory (DRAM) is used as a non-volatile memory, a writing transistor needs to have an extremely low off-state current. The off-state current affects the retention time because a change from $1 \times 10^{-23}$ A to $1 \times 10^{-22}$ A increases the leakage current tenfold, even though the value is in the range of an extremely low off-state current. However, a change in the extremely low off-state current cannot be measured with the retention time unless the measurement time is as long as one year or ten years.

To verify that the off-state current is extremely low, the off-state current can be estimated from the threshold voltage of a writing transistor and the slope of the current-voltage curve in the subthreshold region (also referred to as a subthreshold swing value or an S value and defined as the amount of decrease in gate potential that is needed for a drain current to be reduced by one digit). Patent Document 1 discloses a method of determining the threshold voltage of a writing transistor in a memory device module.

REFERENCE

Patent Document

[Patent Document 1] Japanese Published Patent Application No. 2012-89224

SUMMARY OF THE INVENTION

The method disclosed in Patent Document 1 has several problems. Specifically, when charge is retained in a capacitor in a memory device and read from a detection amplifier, the potential held in the capacitor sometimes cannot be output without any change due to parasitic capacitance of a wiring on an input terminal side of the amplifier.

The parasitic capacitance of a wiring depends on the distance with a peripheral wiring, the film thickness between the wiring and an intersecting wiring, and the like. Furthermore, even when the same detection amplifier is used, the parasitic capacitance sometimes varies with manufacturing variations in memory devices.

In addition, the storage capacitance of a capacitor in a memory device differs with manufacturing variations in the area of capacitor electrodes or the film thickness between the electrodes.

The potential output from the amplifier is influenced by the variations in the parasitic capacitance and the storage capacitance of capacitors. This makes it difficult to estimate the threshold voltage $V_{th}$ of a writing transistor from the potential written to a memory cell.

An object of one embodiment of the present invention is to provide a novel semiconductor device. Another object of one embodiment of the present invention is to provide a module including the novel semiconductor device. Another object of one embodiment of the present invention is to provide an electronic device using the module including the novel semiconductor device. Another object of one embodiment of the present invention is to provide a novel memory device, a novel module, a novel electronic device, a novel system, and the like.

An object of one embodiment of the present invention is to provide a semiconductor device in which the threshold voltage of a writing transistor can be measured accurately. Another object of one embodiment of the present invention is to provide a test method capable of measuring the threshold voltage of a writing transistor accurately.

Note that the objects of one embodiment of the present invention are not limited to those listed above. The above objects do not exclude the existence of other objects. The other objects are the ones that are not described above and will be described below. The other objects will be apparent from and can be derived from the description of the specification, the drawings, and the like by those skilled in the art. One embodiment of the present invention solves at least one of the above objects and the other objects. One embodiment of the present invention need not solve all the above objects and the other objects.

(1)

One embodiment of the present invention is a test method of a semiconductor device including a circuit. The circuit includes a first transistor, a capacitor, a retention node, and a first wiring. One of a source and a drain of the first transistor is electrically connected to the first wiring, the other of the source and the drain of the first transistor is electrically connected to the retention node, and a first electrode of the capacitor is electrically connected to the retention node. The test method includes a first step of writing a first potential to the circuit by a first writing operation; a second step of performing a first reading operation on the circuit having undergone the first step, thereby obtaining a potential $V_{WBL1}$ of the first wiring; a third step of writing a second potential to the circuit by a second writing operation; a fourth step of performing a second reading operation on the circuit having undergone the third step, thereby obtaining a potential $V_{WBL2}$ of the first wiring; and a fifth step of calculating a threshold voltage $V_{th}$ of the first transistor. The first writing operation includes a step (W1-1) of supplying a potential $V_{WB}$ to the first wiring; a step (W1-2) of supplying a potential $V_{GM1}$ to a gate of the first transistor after the step (W1-1), thereby establishing electrical continuity between the first wiring and the retention node; and a step (W1-3) of turning off the first transistor after the step (W1-2), thereby bringing the retention node into an electrically floating state. The second writing operation includes a step (W2-1) of supplying the potential $V_{WB}$ to the first wiring; a step (W2-2) of supplying a potential $V_{GM2}$ to the gate of the first transistor after the step (W2-1), thereby establishing electrical continuity between the first wiring and the retention node; and a step (W2-3) of turning off the first transistor after the step (W2-2), thereby bringing the retention node into an electrically floating state. Each of the first reading operation and the second reading operation includes a step (R1) of precharging the first wiring to a third potential; a step (R2) of bringing the first wiring into an electrically floating state; and a step (R3) of turning on the first transistor, thereby establishing electrical continuity between the first wiring and the retention node. The potentials $V_{GM1}$ and $V_{GM2}$ satisfy the following formula (a1). The fifth step includes a step of calculating the threshold voltage $V_{th}$ from the following formula (a2).

$$V_{GM1} > V_{WB} + V_{th} > V_{GM2} \tag{a1}$$

$$V_{WBL2}/V_{WBL1} = (V_{WB} - V_{th})V_{WB} \tag{a2}$$

(2)

Another embodiment of the present invention is the test method according to (1), in which the first transistor includes an oxide semiconductor in a channel formation region.

(3)

Another embodiment of the present invention is the test method according to (1) or (2), in which the circuit includes a second transistor, a gate of the second transistor is electrically connected to the retention node, and one of a source and a drain of the second transistor is electrically connected to the first wiring.

(4)

Another embodiment of the present invention is the test method according to (1) or (2), in which the circuit includes a second transistor and a second wiring, a gate of the second transistor is electrically connected to the retention node, and one of a source and a drain of the second transistor is electrically connected to the second wiring.

(5)

Another embodiment of the present invention is the test method according to (1) or (2), in which the circuit includes a second transistor and a third transistor, a gate of the second transistor is electrically connected to the retention node, one of a source and a drain of the third transistor is electrically connected to one of a source and a drain of the second transistor, and the other of the source and the drain of the third transistor is electrically connected to the first wiring.

(6)

Another embodiment of the present invention is the test method according to (1) or (2), in which the circuit includes a second transistor, a third transistor, and a second wiring, a gate of the second transistor is electrically connected to the retention node, one of a source and a drain of the third transistor is electrically connected to one of a source and a drain of the second transistor, and the other of the source and the drain of the third transistor is electrically connected to the second wiring.

(7)

Another embodiment of the present invention is the test method according to (4) or (5), in which the second transistor includes single crystal silicon in a channel formation region.

(8)

Another embodiment of the present invention is the test method according to (6) or (7), in which the second transistor and the third transistor each include single crystal silicon in a channel formation region.

According to one embodiment of the present invention, a novel semiconductor device can be provided. According to another embodiment of the present invention, a module including the novel semiconductor device can be provided.

According to another embodiment of the present invention, an electronic device using the module including the novel semiconductor device can be provided. According to another embodiment of the present invention, a novel memory device, a novel module, a novel electronic device, a novel system, and the like can be provided.

According to one embodiment of the present invention, a semiconductor device in which the threshold voltage of a writing transistor can be measured accurately can be provided. According to another embodiment of the present invention, a test method capable of measuring the threshold voltage of a writing transistor accurately can be provided.

Note that the effects of one embodiment of the present invention are not limited to those listed above. The above effects do not exclude the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Hence, one embodiment of the present invention does not have the above effects in some cases.

BRIEF DESCRIPTION OF THE DRAWINGS

In the accompanying drawings:

FIG. 4 is a flowchart showing an operation example of a semiconductor device of one embodiment of the present invention;

FIGS. 12A to 12C are a top view and cross-sectional views showing a structure example of a transistor;

FIGS. 18A and 18B are cross-sectional views showing a configuration example of a memory cell;

DETAILED DESCRIPTION OF THE INVENTION

In this specification, an oxide semiconductor is referred to as an OS in some cases. Thus, a transistor including an oxide semiconductor in a channel formation region is referred to as an OS transistor in some cases.

Embodiment 1

In this embodiment, a semiconductor device disclosed of one embodiment of the disclosed invention will be described.
<Configuration Example>

Figure 5:
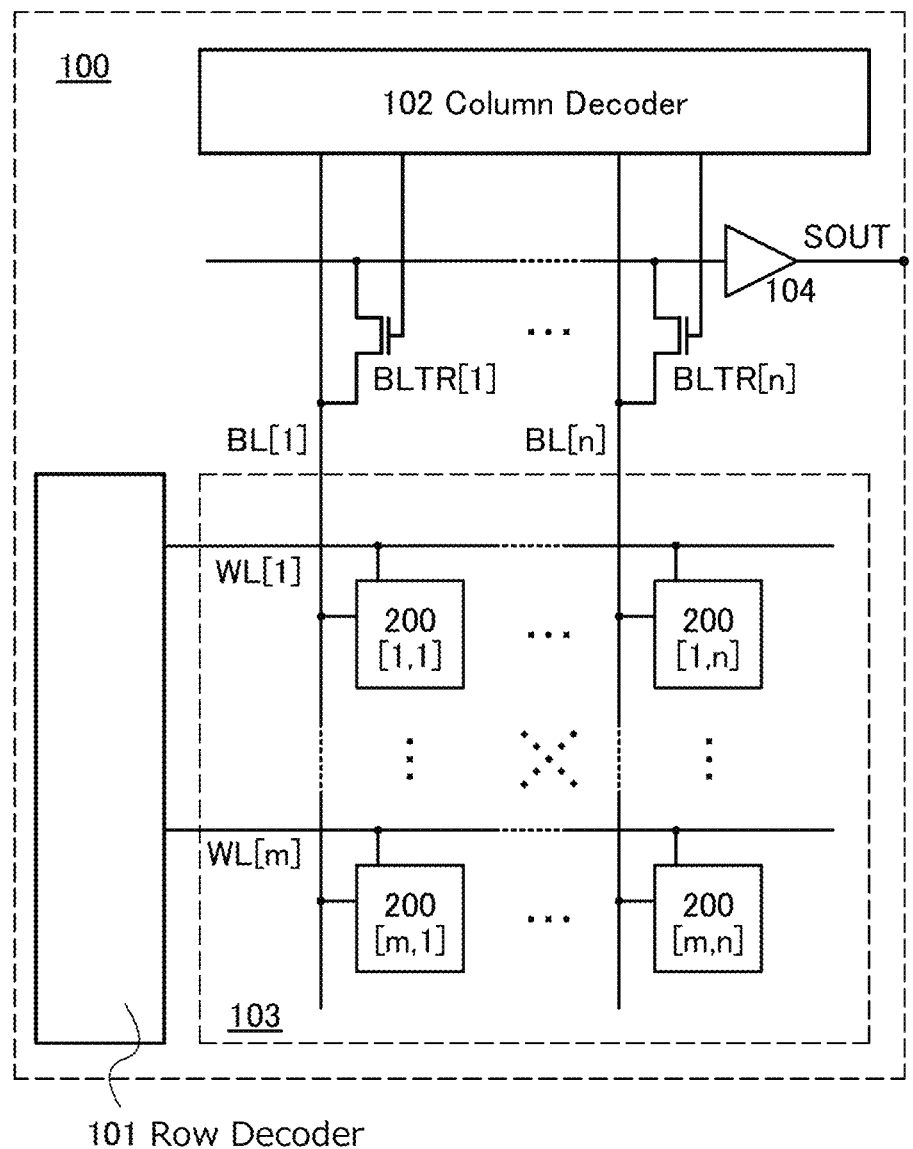
FIG. 5 is a block diagram showing a configuration example of a memory device of one embodiment of the present invention.
Figure 6A:
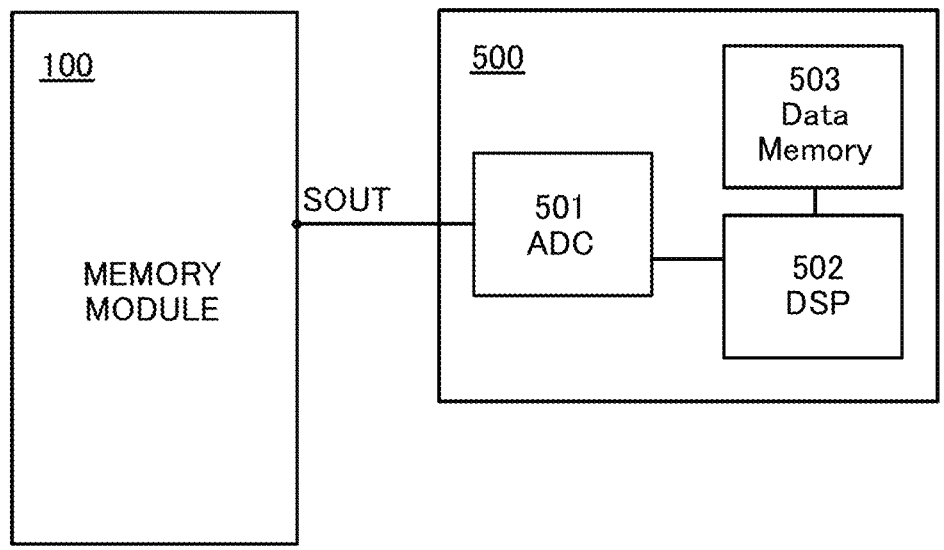
FIGS. 6A and 6B are block diagrams showing configuration examples of a semiconductor device of one embodiment of the present invention.
Figure 6B:
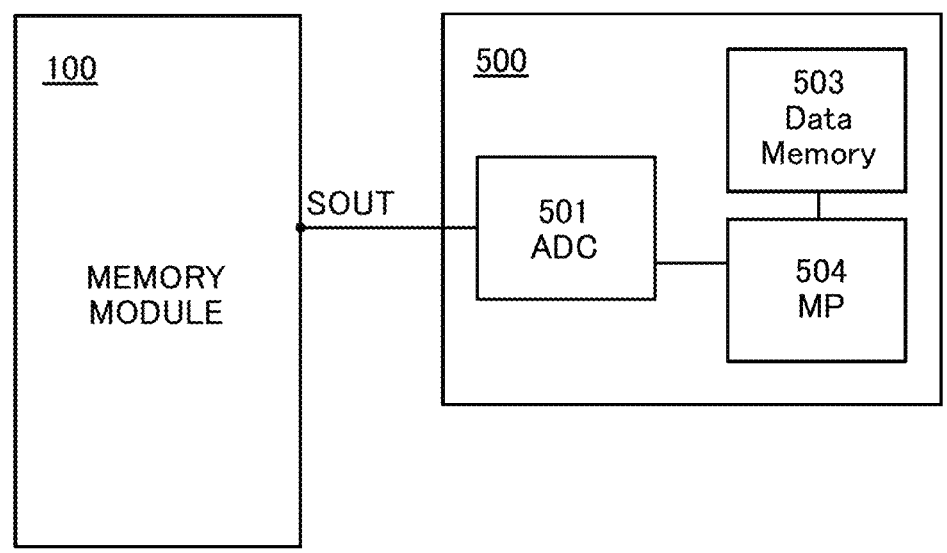

FIG. 5 and FIGS. 6A and 6B show configuration examples of a semiconductor device of one embodiment of the present invention. In FIG. 5, a semiconductor device 100 is a memory module (denoted as MEMORY MODULE in FIGS. 6A and 6B), and includes a row decoder 101 (denoted as Row Decoder in FIG. 5), a column decoder 102 (denoted as Column Decoder in FIG. 5), a memory cell array 103, a buffer circuit 104, and transistors BLTR[1] to BLTR[n].

The memory cell array 103 includes memory cells 200[1,1] to 200[m,n] (in FIG. 5, the memory cell 200[1,1], the memory cell 200[1,n], the memory cell 200[m,1], and the memory cell 200[m,n] are only shown and the other memory cells are omitted). Specifically, the memory cells 200[i,j] are provided in a matrix of n columns and m rows (i is an integer of 1 to m and j is an integer of 1 to n).

The semiconductor device 100 also includes wirings WL[1] to WL[m] and wirings BL[1] to BL[n]. The row decoder 101 is electrically connected to the wirings WL[1] to WL[m], and the column decoder 102 is electrically connected to the wirings BL[1] to BL[n]. The wiring WL[i] is electrically connected to memory cells 200[i,1] to 200[i, n], and the wiring BL[j] is electrically connected to memory cells 200[1,j] to 200[m,j].

An input terminal of the buffer circuit 104 is electrically connected to one of a source and a drain of a transistor BLTR[j], and an output terminal of the buffer circuit 104 is electrically connected to a terminal SOUT. Preferably used as the buffer circuit is a voltage follower circuit with one-time amplification degree or an operational amplifier with an amplification degree corresponding to a signal amplitude.

The other of the source and the drain of the transistor BLTR[j] is electrically connected to the wiring BL[j]. Gates of the transistors BLTR[1] to BLTR[n] are electrically connected to the column decoder 102. Note that the transistors BLTR[1] to BLTR[n] are not limited to transistors and can be replaced with other elements that can control conductive and non-conductive states. For example, an electrical switch, a mechanical switch, or a micro electro mechanical system (MEMS) can be used instead of the transistors.

FIG. 6A shows a configuration in which the semiconductor device 100 is electrically connected to a test circuit 500. The semiconductor device 100 is the memory module shown in FIG. 5, and the test circuit 500 calculates the amount of change in threshold voltage.

The semiconductor device 100 includes a terminal SOUT. The test circuit 500 includes an analog/digital converter circuit 501 (denoted as ADC in FIG. 6A), a digital signal processor 502 (denoted as DSP in FIG. 6A), and a memory device 503 (denoted as Data Memory in FIG. 6A).

The analog/digital converter circuit 501 is electrically connected to the terminal SOUT of the semiconductor device 100. The analog/digital converter circuit 501 is electrically connected to the digital signal processor 502, and the digital signal processor 502 is electrically connected to the memory device 503.

Note that a microprocessor may be used instead of the digital signal processor. A block diagram in that case is shown in FIG. 6B. A microprocessor 504 (denoted as MP in FIG. 6B) is electrically connected to the analog/digital converter circuit 501 and the memory device 503.
<Operation Example>

Next, an operation example of the above configuration will be described with reference to a flowchart of FIG. 1.

Figure 1:
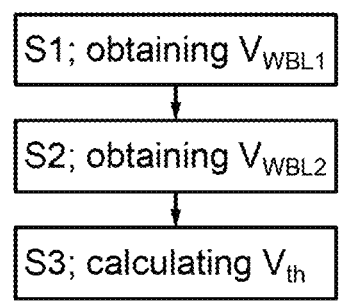
FIG. 1 is a flowchart showing an operation example of a semiconductor device of one embodiment of the present invention.

The operation example shown in FIG. 1 is broadly divided into three steps. Specifically, the operation in Step S1 includes Step S1-1 to Step S1-8 shown in FIG. 2; the operation in Step S2 includes Step S2-1 to Step S2-8 shown in FIG. 3; and the operation in Step S3 includes Step S3-1 and S3-2 in FIG. 4.

In Step S1-1 to Step S1-3, a writing operation W1 to a memory cell is performed. In Step S1-4 to Step S1-6, a reading operation R1 from the memory cell is performed. In Step S1-7 and Step S1-8, an acquisition operation E1 of a potential $V_{WBL1}$, which is obtained through the writing operation W1 and the reading operation R1, is performed.

In Step S2-1 to Step S2-3, a writing operation W2 to a memory cell is performed. In Step S2-4 to Step S2-6, a reading operation R2 from the memory cell is performed. In Step S2-7 and Step S2-8, an acquisition operation E2 of a potential $V_{WBL2}$, which is obtained through the writing operation W2 and the reading operation R2, is performed.

Figure 7:
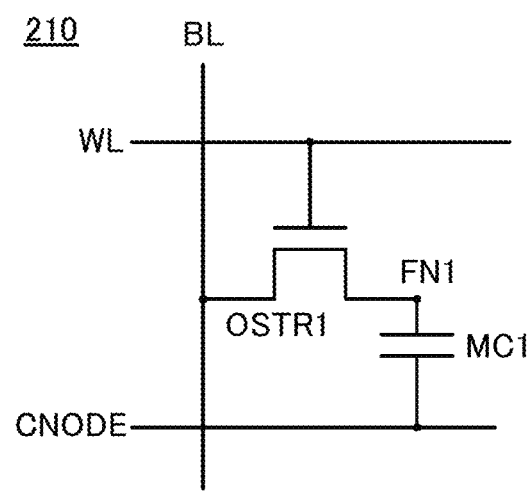
FIG. 7 is a circuit diagram showing a configuration example of a memory cell of one embodiment of the present invention.

Note that in the description of this operation example, the memory cell 200[i,j] in the memory cell array 103 is regarded as a memory cell 210 shown in FIG. 7.

FIG. 7 shows a memory cell including one transistor and one capacitor. The memory cell 210 includes a transistor OSTR1, a retention node FN1, and a capacitor MC1.

One of a source and a drain of the transistor OSTR1 is electrically connected to the wiring BL, the other of the source and the drain of the transistor OSTR1 is electrically connected to the retention node FN1, and a gate of the transistor OSTR1 is electrically connected to the wiring WL. One electrode of the capacitor MC1 is electrically connected to the retention node FN1, and the other electrode of the capacitor MC1 is electrically connected to a wiring CNODE.

Data of the memory cell 210 is retained at the retention node FN1. The transistor OSTR1 serves as a switch establishing electrical continuity between the retention node FN1 and the wiring BL. A writing signal and a reading signal are input and output to/from the wiring BL. A memory cell selection signal is input to the wiring WL. The wiring CNODE is a wiring for the capacitor MC1 and supplied with a GND potential. Note that the GND potential refers to a ground potential.

Data writing and reading are performed by turning on the transistor OSTR1 and establishing electrical continuity between the retention node FN1 and the wiring BL. Note that in this operation example, a writing voltage $V_{WB}$ is applied to the wiring BL.

The transistor OSTR1 preferably contains an oxide semiconductor (preferably an oxide containing In, Ga, and Zn) in a channel formation region. Consequently, the off-state current (leakage current) flowing between a source and a drain is extremely low; thus, a voltage variation of the retention node FN1 can be suppressed. That is to say, the memory cell 210 can be operated as a nonvolatile memory circuit or a memory circuit that can retain data for a long time without power supply.

<<Step S1>>

In Step S1, the potential $V_{WBL1}$ of the wiring BL is output and stored in the memory device 503. Note that the potential $V_{WBL1}$ will be described in Step S1-6.

In Step S1-1, a potential $V_{GM1}$ is applied to the gate of the transistor OSTR1. At this time, the potential $V_{GM1}$ is greater than the sum of the potential $V_{WB}$ and a threshold voltage $V_{th}$ of the transistor OSTR1.

In Step S1-2, the potential $V_{WB}$ is applied to the wiring BL. Then, electrical continuity is established between the source and the drain of the transistor OSTR1, so that the potential of the wiring BL is written to the retention node FN1. That is, the potential of the retention node FN1 is approximately equal to $V_{WB}$.

In Step S1-3, the GND potential is applied to the gate of the transistor OSTR1. Then, the electrical continuity between the source and the drain of the transistor OSTR1 is broken, so that the retention node FN1 is brought into a floating state and retains the potential $V_{WB}$.

In Step S1-4, the wiring BL is precharged to the GND potential.

Figure 2:
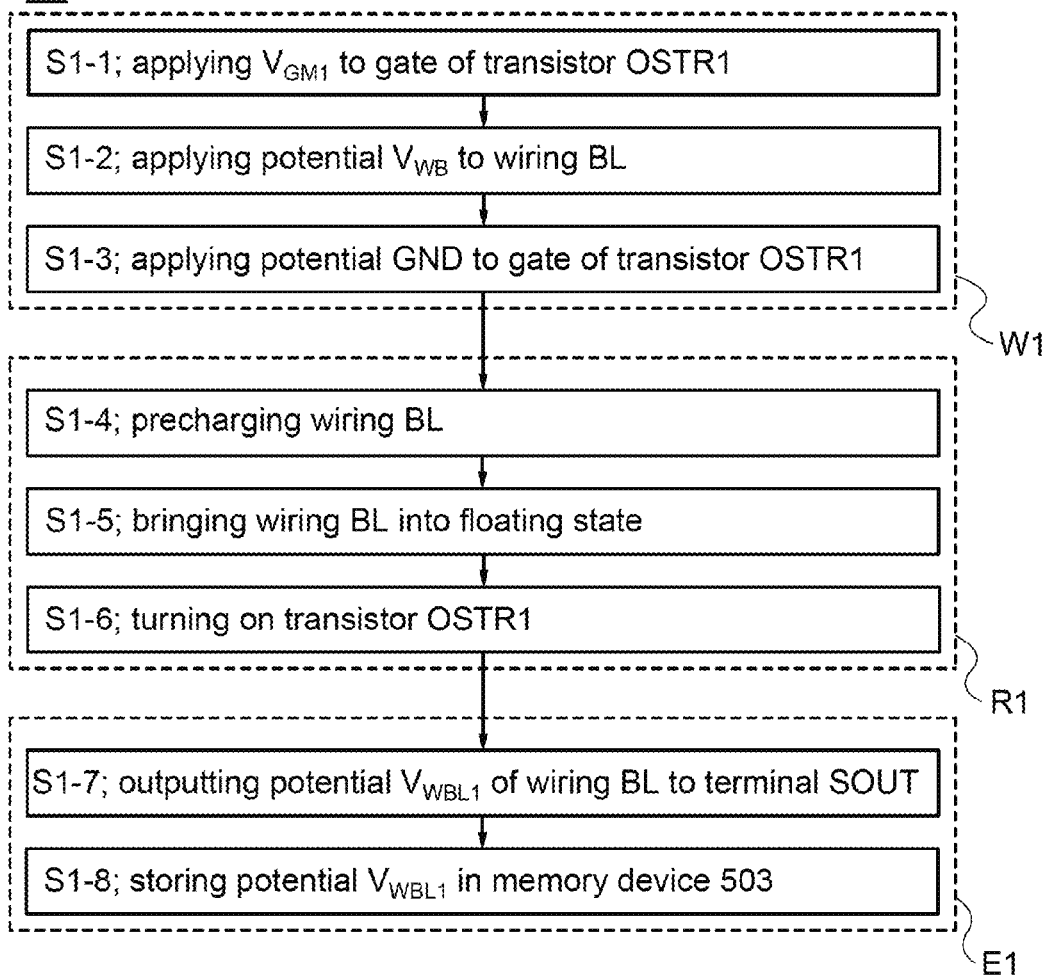
FIG. 2 is a flowchart showing an operation example of a semiconductor device of one embodiment of the present invention.
Figure 3:
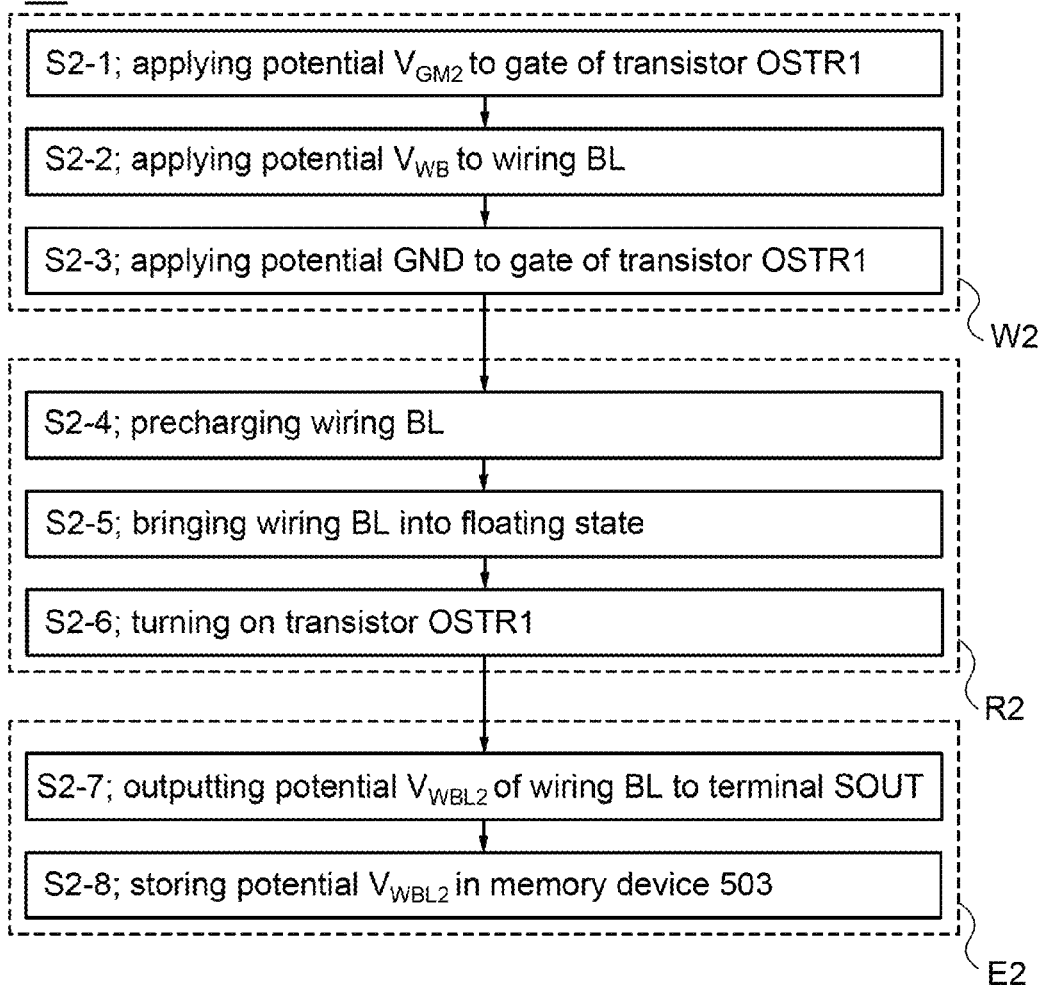
FIG. 3 is a flowchart showing an operation example of a semiconductor device of one embodiment of the present invention.

In Step S1-5, the wiring BL is brought into a floating state (in FIG. 2, denoted as an electrically floating state). Specifically, electrical continuity between any wiring supplied with a signal or a voltage and the wiring BL is broken inside the column decoder 102, and electrical continuity between the source and the drain of the transistor BLTR connected to the wiring BL is broken.

In Step S1-6, a potential is applied to the gate of the transistor OSTR1 so that electrical continuity is established between the source and the drain of the transistor OSTR1. When electrical continuity between the source and the drain of the transistor OSTR1 is established, the charge retained at the retention node FN1 is transferred to the wiring BL. The potential of the wiring BL at this time is $V_{WBL1}$. The potential $V_{WBL1}$ of the wiring BL is expressed by the following formula where $C_s$ represents the capacitance of the capacitor MC1 and $C_B$ represents the parasitic capacitance of the wiring BL.

$$V_{WBL1} = V_{WB} \times C_s / (C_B + C_s)$$

In Step S1-7, the potential $V_{WBL1}$ of the wiring BL is output to the terminal SOUT. Specifically, the column decoder 102 establishes electrical continuity between the source and the drain of the transistor BLTR, so that the potential $V_{WBL1}$ of the wiring BL is input to the input terminal of the buffer circuit 104 and then output from the output terminal of the buffer circuit 104 to the terminal SOUT.

In Step S1-8, the potential $V_{WBL1}$ input from the terminal SOUT is converted into a digital value and stored in the memory device 503 in the test circuit 500. Since the output terminal of the buffer circuit 104 is connected to the input terminal of the analog/digital converter circuit 501, the potential $V_{WBL1}$ is input to the input terminal of the analog/digital converter circuit 501 and converted into a digital value. The converted potential $V_{WBL1}$ is stored in the memory device 503 through the digital signal processor 502.

<<Step S2>>

In Step S2, the potential $V_{WBL2}$ of the wiring BL is output and stored in the memory device 503. Note that the potential $V_{WBL2}$ will be described in Step S2-6.

In Step S2-1, a potential $V_{GM2}$ is applied to the gate of the transistor OSTR1. At this time, the potential $V_{GM2}$ is less than the sum of the potential $V_{WB}$ and the threshold voltage $V_{th}$ of the transistor OSTR1.

In Step S2-2, the potential $V_{WB}$ is applied to the wiring BL. Then, electrical continuity is established between the source and the drain of the transistor OSTR1, so that a potential is written to the retention node FN1. Since the potential of the gate of the transistor OSTR1 is less than the sum of the potential $V_{WB}$ and the threshold voltage $V_{th}$ of the transistor OSTR1, the potential written to the retention node FN1 is $V_{WB} - V_{th}$.

In Step S2-3, the GND potential is applied to the gate of the transistor OSTR1. Then, the electrical continuity between the source and the drain of the transistor OSTR1 is broken, so that the retention node FN1 is brought into a floating state and retains the potential $V_{WB} - V_{th}$.

In Step S2-4, the wiring BL is precharged to the GND potential.

In Step S2-5, the wiring BL is brought into a floating state (in FIG. 2, denoted as an electrically floating state). Specifically, electrical continuity between any wiring supplied with a signal or a voltage and the wiring BL is broken inside the column decoder 102, and electrical continuity between the source and the drain of the transistor BLTR connected to the wiring BL is broken.

In Step S2-6, a potential is applied to the gate of the transistor OSTR1 so that electrical continuity is established between the source and the drain of the transistor OSTR1. When electrical continuity between the source and the drain of the transistor OSTR1 is established, the charge retained at the retention node FN1 is transferred to the wiring BL. The potential of the wiring BL at this time is $V_{WBL2}$. The potential $V_{WBL2}$ of the wiring BL is expressed by the following formula where $C_s$ represents the capacitance of the capacitor MC1 and $C_B$ represents the parasitic capacitance of the wiring BL.

$$V_{WBL2}=(V_{WB}-V_{th})\times C_s/(C_B+C_s)$$

In Step S2-7, the potential $V_{WBL2}$ of the wiring BL is output to the terminal SOUT. Specifically, the column decoder 102 establishes electrical continuity between the source and the drain of the transistor BLTR, so that the potential $V_{WBL2}$ of the wiring BL is input to the input terminal of the buffer circuit 104 and then output from the output terminal of the buffer circuit 104 to the terminal SOUT.

In Step S2-8, the potential $V_{WBL2}$ input from the terminal SOUT is converted into a digital value and stored in the memory device 503 in the test circuit 500. Since the output terminal of the buffer circuit 104 is connected to the input terminal of the analog/digital converter circuit 501, the potential $V_{WBL2}$ is input to the input terminal of the analog/digital converter circuit 501 and converted into a digital value. The converted potential $V_{WBL2}$ is stored in the memory device 503 through the digital signal processor 502.

<<Step S3>>

In Step S3-1, the potential $V_{WBL1}$ obtained in Step S1 and the potential $V_{WBL2}$ obtained in Step S2 are read from the memory device 503 and transmitted to the digital signal processor 502.

In the subsequent Step S3-2, $V_{WBL2}/V_{WBL1}$ is calculated by the digital signal processor 502.

The following formula can be obtained from the formulae expressing $V_{WBL1}$ and $V_{WBL2}$ in Steps S1 and S2.

$$V_{WBL2}/V_{WBL1}=(V_{WB}-V_{th})/V_{WB}$$

$V_{WBL2}/V_{WBL1}$ and $V_{WB}$, which are respectively the calculated value obtained in the digital signal processor 502 and the writing potential, are already known. Thus, $V_{th}$ can be calculated by the substitution of $V_{WBL2}/V_{WBL1}$ and $V_{WB}$. This allows the threshold voltage $V_{th}$ of the transistor OSTR1 to be calculated independently of variations in the storage capacitance of the capacitor MC1 and the parasitic capacitance $C_B$ of the wiring BL.

When the memory cells 200[1,1] to 200[m,n] are subjected to Steps S1 to S3, the threshold voltages $V_{th}$ of all the transistors OSTR1 in the memory cell array 103 can be obtained.

The aforementioned method allows variations in the threshold voltages $V_{th}$ of the writing transistors in the memory device to be figured out. Consequently, the semiconductor device or the memory device can be evaluated.

Note that this embodiment can be combined with any of the other embodiments in this specification as appropriate.

Embodiment 2

Described next is a memory cell in which the threshold voltage of a writing transistor can be calculated, which is different from the memory cell 210 shown in Embodiment 1.

Figure 8A:
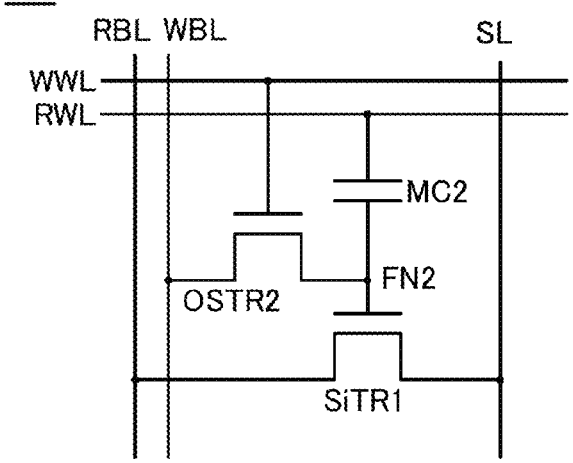
FIGS. 8A to 8C are circuit diagrams showing configuration examples of a memory cell of one embodiment of the present invention.
Figure 8B:
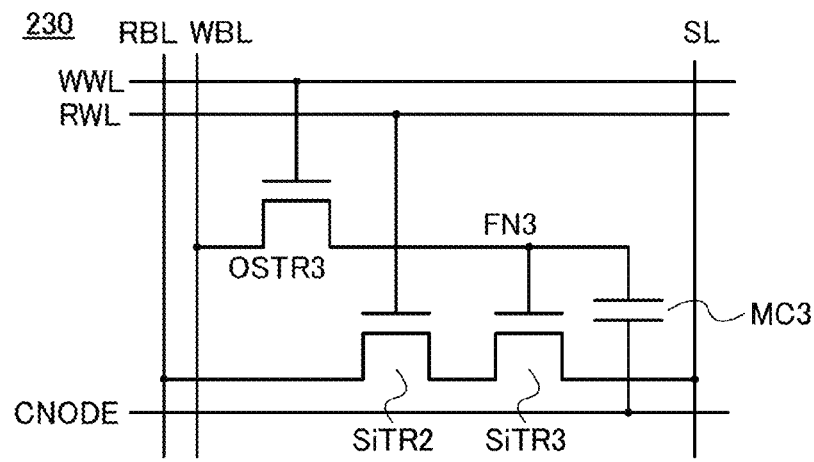
Figure 8C:
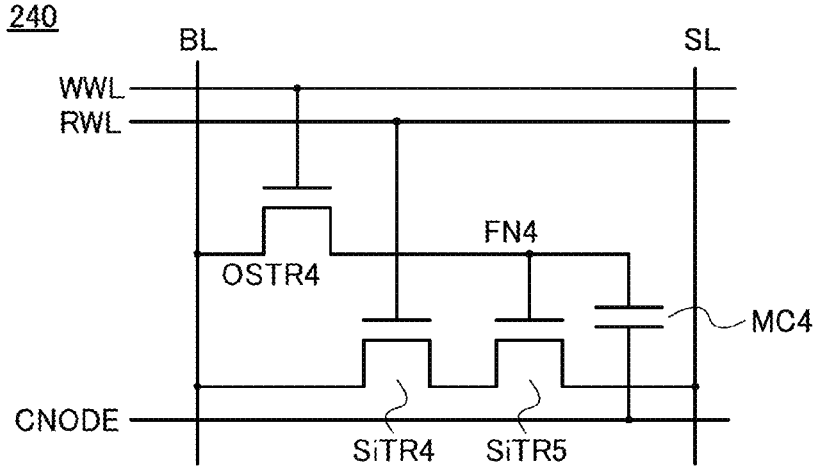

FIGS. 8A to 8C show examples of the memory cell capable of calculating the threshold voltage.

<<Configuration Example 1 of Memory Cell>>

FIG. 8A shows a memory cell including two transistors and one capacitor. A memory cell 220 includes a transistor OSTR2, a transistor SiTR1, a retention node FN2, and a capacitor MC2.

One of a source and a drain of the transistor OSTR2 is electrically connected to a wiring WBL, the other of the source and the drain of the transistor OSTR2 is electrically connected to the retention node FN2, and a gate of the transistor OSTR2 is electrically connected to a wiring WWL. One of a source and a drain of the transistor SiTR1 is electrically connected to a wiring RBL, the other of the source and the drain of the transistor SiTR1 is electrically connected to a wiring SL, and a gate of the transistor SiTR1 is electrically connected to the retention node FN2. One electrode of the capacitor MC2 is electrically connected to the retention node FN2, and the other electrode of the capacitor MC2 is electrically connected to a wiring RWL.

Data of the memory cell 220 is retained at the retention node FN2. The transistor OSTR2 serves as a switch establishing electrical continuity between the retention node FN2 and the wiring WBL.

A writing signal is input to the wiring WBL. A reading signal is input to the wiring RBL. A memory cell selection signal is input to the wiring WWL. The wiring RWL is a wiring for the capacitor MC2 and supplied with the GND potential.

When data is written, while a constant voltage is applied to the wiring SL, the transistor OSTR2 is turned on so that electrical continuity between the retention node FN2 and the wiring WBL is established. When data is read, a constant voltage is applied to the wirings RBL and SL first. Then, the value of a source-drain current of the transistor SiTR1 changes with the voltage of the retention node FN2. The wiring RBL is charged or discharged with the source-drain current of the transistor SiTR1; accordingly, the data value retained in the memory cell 220 can be read by measuring the voltage of the wiring RBL.

In the case where the memory cell 220 is used as the memory cell 200[i,j] in Embodiment 1, the wiring WBL may be connected to the input terminal of the buffer circuit 104 through the source and the drain of the transistor BLTR[j].

<<Configuration Example 2 of Memory Cell>>

FIG. 8B shows a memory cell including three transistors and one capacitor. A memory cell 230 includes a transistor OSTR3, a transistor SiTR2, a transistor SiTR3, a retention node FN3, and a capacitor MC3.

One of a source and a drain of the transistor OSTR3 is electrically connected to the wiring WBL, the other of the source and the drain of the transistor OSTR3 is electrically connected to the retention node FN3, and a gate of the transistor OSTR3 is electrically connected to the wiring WWL. One of a source and a drain of the transistor SiTR2 is electrically connected to the wiring RBL, the other of the source and the drain of the transistor SiTR2 is electrically connected to one of a source and a drain of the transistor SiTR3, and a gate of the transistor SiTR2 is electrically connected to the wiring RWL. The other of the source and the drain of the transistor SiTR3 is electrically connected to the wiring SL, and a gate of the transistor SiTR3 is electrically connected to the retention node FN3. One electrode of the capacitor MC3 is electrically connected to the retention node FN3, and the other electrode of the capacitor MC3 is electrically connected to the wiring CNODE.

Data of the memory cell 230 is retained at the retention node FN3. The transistor OSTR3 serves as a switch establishing electrical continuity between the retention node FN3 and the wiring WBL. The wiring CNODE is a wiring for the capacitor MC3, which is used for supplying a constant voltage to a terminal of the capacitor MC3 in writing and reading operations.

When data is written, the transistor OSTR3 is turned on so that electrical continuity between the retention node FN3 and the wiring WBL is established. When data is read, while a constant voltage is applied to the wirings RBL and SL, the transistor SiTR2 is turned on. The value of a source-drain current of the transistor SiTR3 changes with the voltage of the retention node FN3. The wiring RBL is charged or discharged with the source-drain current of the transistor SiTR3; accordingly, the data value retained in the memory cell 230 can be read by measuring the voltage of the wiring RBL.

In the case where the memory cell 230 is used as the memory cell 200[i,j] in Embodiment 1, the wiring WBL may be connected to the input terminal of the buffer circuit 104 through the source and the drain of the transistor BLTR[j].

<<Configuration Example 3 of Memory Cell>>

FIG. 8C shows a memory cell including three transistors and one capacitor. A memory cell 240 includes a transistor OSTR4, a transistor SiTR4, a transistor SiTR5, a retention node FN4, and a capacitor MC4. The memory cell 240 has a configuration in which the wirings RBL and WBL in the memory cell 230 are combined into one wiring BL.

One of a source and a drain of the transistor OSTR4 is electrically connected to the wiring BL, the other of the source and the drain of the transistor OSTR4 is electrically connected to the retention node FN4, and a gate of the transistor OSTR4 is electrically connected to the wiring WWL. One of a source and a drain of the transistor SiTR4 is electrically connected to the wiring BL, the other of the source and the drain of the transistor SiTR4 is electrically connected to one of a source and a drain of the transistor SiTR5, and a gate of the transistor SiTR4 is electrically connected to the wiring RWL. The other of the source and the drain of the transistor SiTR5 is electrically connected to the wiring SL, and a gate of the transistor SiTR5 is electrically connected to the retention node FN4. One electrode of the capacitor MC4 is electrically connected to the retention node FN4, and the other electrode of the capacitor MC4 is electrically connected to the wiring CNODE.

Data of the memory cell 240 is retained at the retention node FN4. The transistor OSTR4 serves as a switch establishing electrical continuity between the retention node FN4 and the wiring BL. The wiring CNODE is a wiring for the capacitor MC4, which is used for supplying a constant voltage to a terminal of the capacitor MC4 in writing and reading operations.

When data is written, the transistor OSTR4 is turned on so that electrical continuity between the retention node FN4 and the wiring BL is established. When data is read, while a constant voltage is applied to the wirings BL and SL, the transistor SiTR4 is turned on. The value of a source-drain current of the transistor SiTR5 changes with the voltage of the retention node FN4. The wiring BL is charged or discharged with the source-drain current of the transistor SiTR5; accordingly, the data value retained in the memory cell 240 can be read by measuring the voltage of the wiring BL.

In the case where the memory cell 240 is used as the memory cell 200[i,j] in Embodiment 1, the wiring BL may be connected to the input terminal of the buffer circuit 104 through the source and the drain of the transistor BLTR[j].

The aforementioned memory cell 220 as well as the memory cell 240 can also have a configuration in which the wirings RBL and WBL are combined into one wiring, and can be applied to Embodiment 1.

The transistors OSTR2 to OSTR4 preferably contain an oxide semiconductor (preferably an oxide containing In, Ga, and Zn) in a channel formation region. Consequently, the off-state current (leakage current) flowing between a source and a drain is extremely low; thus, a voltage variation of the retention nodes FN2 to FN4 can be suppressed. That is to say, the memory cells 220, 230, and 240 can be operated as a nonvolatile memory circuit or a memory circuit that can retain data for a long time without power supply.

Note that this embodiment can be combined with any of the other embodiments in this specification as appropriate.

Embodiment 3

Described in this embodiment are structures of an OS transistor that can be used as the transistors OSTR1 to OSTR4 shown in the above embodiments.

<Structure Example 1 of Transistor>

Figure 9A:
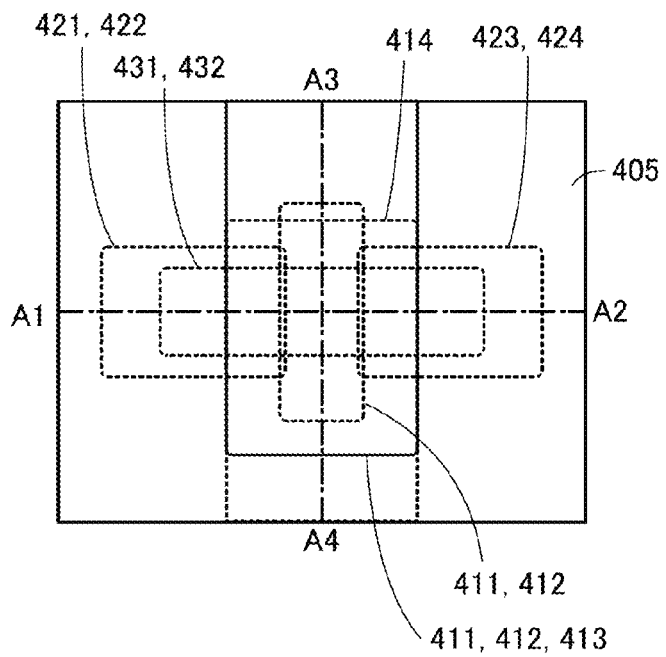
FIGS. 9A to 9C are a top view and cross-sectional views showing a structure example of a transistor.
Figure 9B:
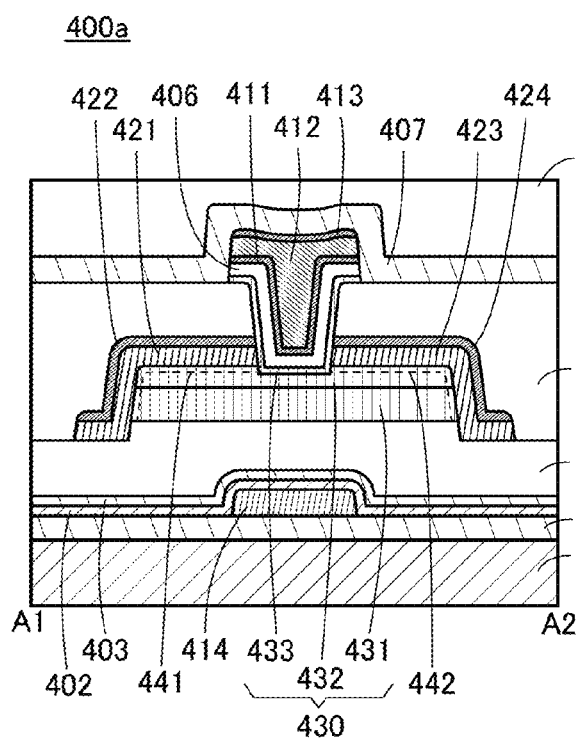
Figure 9C:
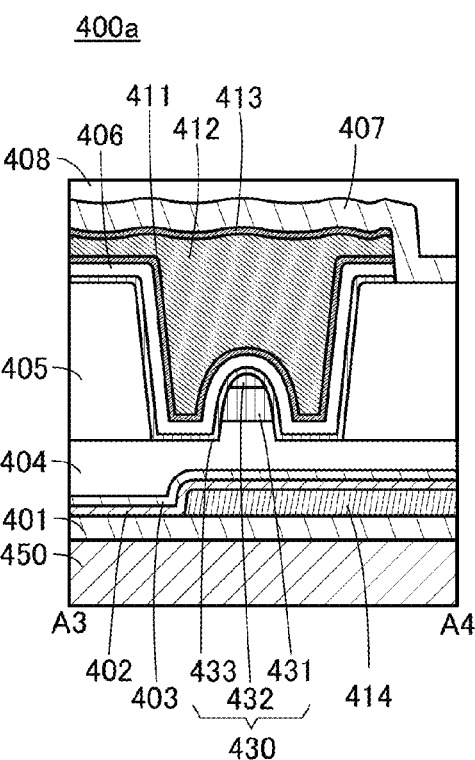

FIGS. 9A to 9C are a top view and cross-sectional views of a transistor 400a. FIG. 9A is a top view. FIG. 9B is a cross-sectional view taken along dashed-dotted line A1-A2 in FIG. 9A and FIG. 9C is a cross-sectional view taken along dashed-dotted line A3-A4 in FIG. 9A. Note that for simplification of the drawing, some components are not illustrated in the top view in FIG. 9A. Note that the dashed-dotted line A1-A2 and the dashed-dotted line A3-A4 are sometimes referred to as a channel length direction of the transistor 400a and a channel width direction of the transistor 400a, respectively.

The transistor 400a includes a substrate 450, an insulating film 401 over the substrate 450, a conductive film 414 over the insulating film 401, an insulating film 402 covering the conductive film 414, an insulating film 403 over the insulating film 402, an insulating film 404 over the insulating film 403, a metal oxide 431 and a metal oxide 432 which are stacked in this order over the insulating film 404, a conductive film 421 touching top and side surfaces of the metal oxide 432, a conductive film 423 also touching the top and side surfaces of the metal oxide 432, a conductive film 422 over the conductive film 421, a conductive film 424 over the conductive film 423, an insulating film 405 over the conductive films 422 and 424, a metal oxide 433 touching the metal oxides 431 and 432, the conductive films 421 to 424, and the insulating film 405, an insulating film 406 over the metal oxide 433, a conductive film 411 over the insulating film 406, a conductive film 412 over the conductive film 411, a conductive film 413 over the conductive film 412, an insulating film 407 covering the conductive film 413, and an insulating film 408 over the insulating film 407. Note that the metal oxides 431 to 433 are collectively referred to as a metal oxide 430.

The metal oxide 432 is a semiconductor and serves as a channel of the transistor 400a.

Furthermore, the metal oxides 431 and 432 include a region 441 and a region 442. The region 441 is formed in the vicinity of a region where the conductive film 421 is in contact with the metal oxides 431 and 432. The region 442 is formed in the vicinity of a region where the conductive film 423 is in contact with the metal oxides 431 and 432.

The regions 441 and 442 serve as low-resistance regions. The region 441 contributes to a decrease in the contact resistance between the conductive film 421 and the metal oxides 431 and 432. The region 442 also contributes to a decrease in the contact resistance between the conductive film 423 and the metal oxides 431 and 432.

The conductive films 421 and 422 serve as one of source and drain electrodes of the transistor 400a. The conductive films 423 and 424 serve as the other of the source and drain electrodes of the transistor 400a.

The conductive film 422 is configured to allow less oxygen to pass therethrough than the conductive film 421. It is thus possible to prevent a decrease in the conductivity of the conductive film 421 due to oxidation.

The conductive film 424 is also configured to allow less oxygen to pass therethrough than the conductive film 423. It is thus possible to prevent a decrease in the conductivity of the conductive film 423 due to oxidation.

The conductive films 411 to 413 serve as a first gate electrode of the transistor 400a.

The conductive films 411 and 413 are configured to allow less oxygen to pass therethrough than the conductive film 412. It is thus possible to prevent a decrease in the conductivity of the conductive film 412 due to oxidation.

The insulating film 406 serves as a first gate insulating film of the transistor 400a.

The conductive film 414 serves as a second gate electrode of the transistor 400a.

The potential applied to the conductive films 411 to 413 may be the same as or different from that applied to the conductive film 414. The conductive film 414 may be omitted in some cases.

The insulating films 401 to 404 serve as a base insulating film of the transistor 400a. The insulating films 402 to 404 also serve as a second gate insulating film of the transistor 400a.

The insulating films 405 to 408 serve as a protective insulating film or an interlayer insulating film of the transistor 400a.

As shown in FIG. 9C, the side surface of the metal oxide 432 is surrounded by the conductive film 411. With this structure, the metal oxide 432 can be electrically surrounded by an electric field of the conductive film 411. Such a structure of a transistor in which a semiconductor is electrically surrounded by an electric field of a gate electrode is referred to as a surrounded channel (s-channel) structure. Since a channel is formed in the entire metal oxide 432 (bulk) in the s-channel structure, a large amount of current can flow between a source and a drain of a transistor, increasing the on-state current of the transistor.

The s-channel structure, because of its high on-state current, is suitable for a semiconductor device such as large-scale integration (LSI) which requires a miniaturized transistor. A semiconductor device including the miniaturized transistor can have a high integration degree and high density.

In the transistor 400a, a region serving as a gate electrode is formed so as to fill an opening formed in the insulating film 405 or the like, that is, in a self-aligned manner.

As shown in FIG. 9B, the conductive films 411 and 422 have a region where they overlap with each other with the insulating film positioned therebetween. The conductive films 411 and 424 also have a region where they overlap with each other with the insulating film positioned therebetween. These regions serve as the parasitic capacitance caused between the gate electrode and the source or drain electrode and might decrease the operation speed of the transistor 400a. This parasitic capacitance can be reduced by providing the insulating film 405 in the transistor 400a. The insulating film 405 preferably contains a material with a low relative dielectric constant.

Figure 10A:
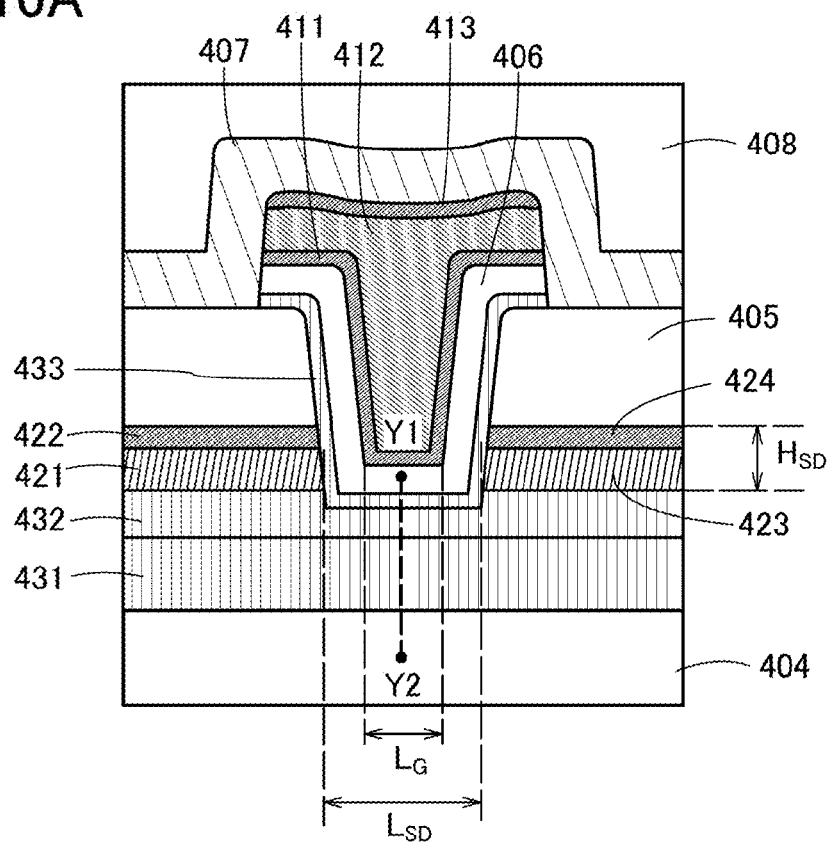
FIG. 10A is a cross-sectional view showing a structure example of a transistor and FIG. 10B is an energy band diagram of the transistor.

FIG. 10A is an enlarged view of the center of the transistor 400a. In FIG. 10A, a width $L_G$ denotes the length of the bottom surface of the conductive film 411, which faces in parallel with the top surface of the metal oxide 432 with the insulating film 406 and the metal oxide 433 positioned therebetween. The width $L_G$ is the line width of the gate electrode. In FIG. 10A, a width $L_{SD}$ denotes the length between the conductive films 421 and 423, i.e., the length between the source electrode and the drain electrode.

The width $L_{SD}$ is generally determined by the minimum feature size. As shown in FIG. 10A, the width $L_G$ is narrower than the width $L_{SD}$. This means that in the transistor 400a, the line width of the gate electrode can be made narrower than the minimum feature size; specifically, the width $L_G$ can be greater than or equal to 5 nm and less than or equal to 60 nm, preferably greater than or equal to 5 nm and less than or equal to 30 nm.

In FIG. 10A, a height $H_{SD}$ denotes the total thickness of the conductive films 421 and 422, or the total thickness of the conductive films 423 and 424.

The thickness of the insulating film 406 is preferably less than or equal to the height $H_{SD}$, in which case the electric field of the gate electrode can be applied to the entire channel formation region. The thickness of the insulating film 406 is less than or equal to 30 nm, preferably less than or equal to 10 nm.

The parasitic capacitance between the conductive films 422 and 411 and the parasitic capacitance between the conductive films 424 and 411 are inversely proportional to the thickness of the insulating film 405. For example, the thickness of the insulating film 405 is preferably three times or more, and further preferably five times or more the thickness of the insulating film 406, in which case the parasitic capacitance is negligibly small. As a result, the transistor 400a can operate at high frequencies.

Components of the transistor 400a will be described below.

<<Metal Oxide Layer>>

First, a metal oxide that can be used as the metal oxides 431 to 433 will be described.

The transistor 400a preferably has a low current (off-state current) flowing between a source and a drain when the transistor 400a is in an off state. Examples of the transistor with a low off-state current include a transistor including an oxide semiconductor in a channel formation region.

The metal oxide 432 is an oxide semiconductor containing indium (In), for example. The metal oxide 432 can have high carrier mobility (electron mobility) by containing indium, for example. The metal oxide 432 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the metal oxide, for example. Furthermore, the metal oxide 432 preferably contains zinc (Zn). When containing zinc, the metal oxide is easily crystallized in some cases.

Note that the metal oxide 432 is not limited to the oxide semiconductor containing indium. The metal oxide 432 may be an oxide semiconductor that does not contain indium and contains at least one of zinc, gallium, and tin (e.g., a zinc tin oxide or a gallium tin oxide).

For the metal oxide 432, an oxide semiconductor with a wide energy gap is used, for example. The energy gap of the metal oxide 432 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The metal oxide 432 is preferably a CAAC-OS film which is described later.

The metal oxides 431 and 433 include, for example, one, or two or more elements other than oxygen included in the metal oxide 432. Since the metal oxides 431 and 433 include one, or two or more elements other than oxygen included in the metal oxide 432, an interface state is less likely to be formed at an interface between the metal oxides 431 and 432 and an interface between the metal oxides 432 and 433.

In the case of using an In-M-Zn oxide as the metal oxide 431, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the metal oxide 431 is formed by a sputtering method, a sputtering target with the above composition is preferably used. For example, In:M:Zn is preferably 1:3:2 or 1:3:4.

In the case of using an In-M-Zn oxide as the metal oxide 432, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the metal oxide 432 is formed by a sputtering method, a sputtering target with the above composition is preferably used. For example, In:M:Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the metal oxide 432 may be 4:2:3 or in the neighborhood of 4:2:3.

In the case of using an In-M-Zn oxide as the metal oxide 433, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. For example, In:M:Zn is preferably 1:3:2 or 1:3:4. The metal oxide 433 may be a metal oxide that is the same type as that of the metal oxide 431.

The metal oxide 431 or the metal oxide 433 does not necessarily contain indium in some cases. For example, the metal oxide 431 or the metal oxide 433 may be gallium oxide.

Figure 10B:
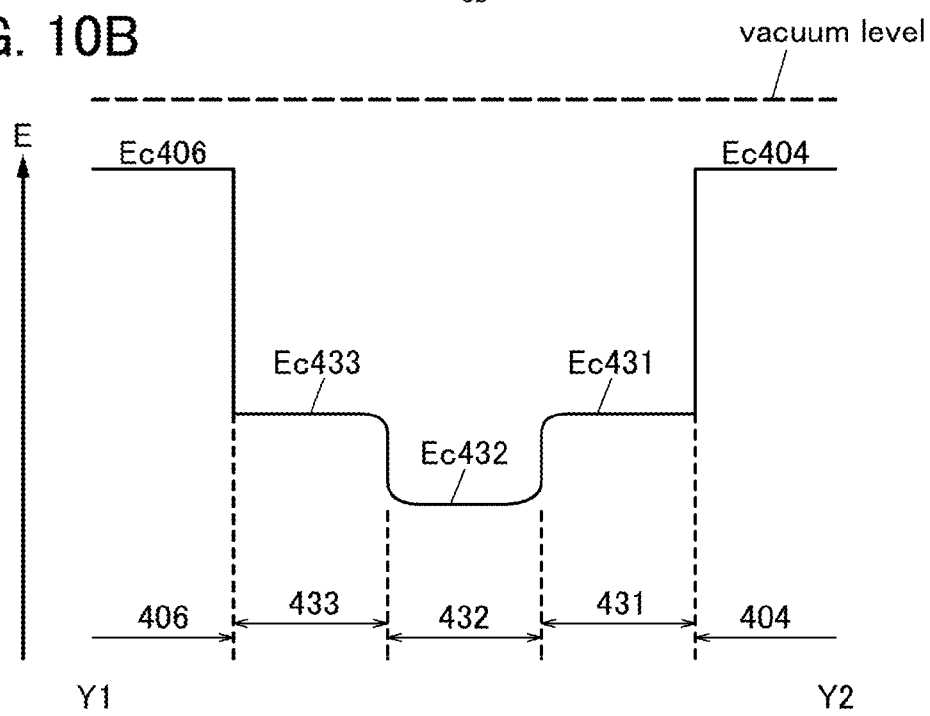

The function and effect of the metal oxide 430, which includes a stack of the metal oxides 431 to 433, are described with reference to the energy band diagram of FIG. 10B. FIG. 10B shows an energy band structure of a portion taken along dashed line Y1-Y2 in FIG. 10A, that is, FIG. 10B shows the energy band structure of a channel formation region of the transistor 400a and the vicinity thereof.

In FIG. 10B, Ec404, Ec431, Ec432, Ec433, and Ec406 indicate the energy at the bottom of the conduction band of the insulating film 404, the metal oxide 431, the metal oxide 432, the metal oxide 433, and the insulating film 406, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulating films 404 and 406 are insulators, Ec406 and Ec404 are closer to the vacuum level (i.e., have a lower electron affinity) than Ec431, Ec432, and Ec433.

The metal oxide 432 is a metal oxide having higher electron affinity than those of the metal oxides 431 and 433. For example, as the metal oxide 432, a metal oxide having an electron affinity higher than those of the metal oxides 431 and 433 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity is an energy gap between the vacuum level and the bottom of the conduction band.

An indium gallium oxide has a low electron affinity and a high oxygen-blocking property. Therefore, the metal oxide 433 preferably includes an indium gallium oxide. The gallium atomic ratio [Ga/(In+Ga)] is, for example, higher than or equal to 70%, preferably higher than or equal to 80%, and more preferably higher than or equal to 90%.

At this time, when a gate voltage is applied, a channel is formed in the metal oxide 432 having the highest electron affinity among the metal oxides 431 to 433.

At this time, electrons move mainly in the metal oxide 432, not in the metal oxides 431 and 433. Hence, the on-state current hardly varies even when the interface state density, which inhibits electron movement, is high at the interface between the metal oxide 431 and the insulating film 404 or at the interface between the metal oxide 433 and the insulating film 406. The metal oxides 431 and 433 have a function as an insulating film.

In some cases, there is a mixed region of the metal oxides 431 and 432 between the metal oxides 431 and 432. Furthermore, in some cases, there is a mixed region of the metal oxides 432 and 433 between the metal oxides 432 and 433. Because the mixed region has a low interface state density, a stack of the metal oxides 431 to 433 has a band structure where energy at each interface and in the vicinity of the interface is changed continuously (continuous junction).

As described above, the interface between the metal oxides 431 and 432 or the interface between the metal oxides 432 and 433 has a low interface state density. Hence, electron movement in the metal oxide 432 is less likely to be inhibited and the on-state current of the transistor can be increased.

Electron movement in the transistor is inhibited, for example, in the case where physical unevenness in a channel formation region is large. To increase the on-state current of the transistor, for example, root mean square (RMS) roughness with a measurement area of 1 μm×1 μm of a top surface or a bottom surface of the metal oxide 432 (a formation surface; here, the top surface of the metal oxide 431) is less than 1 nm, preferably less than 0.6 nm, more preferably less than 0.5 nm, still more preferably less than 0.4 nm. The average surface roughness (Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. The RMS roughness, Ra, and P–V can be measured with, for example, a scanning probe microscope SPA-500 manufactured by SII Nano Technology Inc.

The electron movement is also inhibited in the case where the density of defect states is high in the channel formation region. For example, in the case where the metal oxide 432 contains oxygen vacancies ($V_O$), donor levels are formed by entry of hydrogen into sites of oxygen vacancies in some cases. A state in which hydrogen enters sites of oxygen vacancies is denoted by $V_O H$ in the following description in some cases. $V_O H$ is a factor of decreasing the on-state current of the transistor because $V_O H$ scatters electrons. Note that sites of oxygen vacancies become more stable by entry of oxygen than by entry of hydrogen. Thus, by decreasing oxygen vacancies in the metal oxide 432, the on-state current of the transistor can be increased in some cases.

For example, at a certain depth in the metal oxide 432 or in a certain region of the metal oxide 432, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the metal oxide 432, for example, there is a method in which excess oxygen contained in the insulating film 404 is moved to the metal oxide 432 through the metal oxide 431. In that case, the metal oxide 431 is preferably a layer having an oxygen-transmitting property (a layer through which oxygen passes or is transmitted).

Note that in the case where the transistor has an s-channel structure, a channel is formed in the entire metal oxide 432. Therefore, as the metal oxide 432 has larger thickness, a channel region becomes larger. In other words, the thicker the metal oxide 432 is, the larger the on-state current of the transistor is.

Moreover, the thickness of the metal oxide 433 is preferably as small as possible to increase the on-state current of the transistor. For example, the metal oxide 433 has a region with a thickness of less than 10 nm, preferably less than or equal to 5 nm, more preferably less than or equal to 3 nm. Meanwhile, the metal oxide 433 has a function of blocking entry of elements other than oxygen (such as hydrogen and silicon) included in the adjacent insulator into the metal oxide 432 where a channel is formed. Thus, the metal oxide 433 preferably has a certain thickness. For example, the metal oxide 433 may have a region with a thickness of greater than or equal to 0.3 nm, preferably greater than or equal to 1 nm, more preferably greater than or equal to 2 nm. The metal oxide 433 preferably has an oxygen blocking property to inhibit outward diffusion of oxygen released from the insulating film 404 and the like.

To improve reliability, preferably, the thickness of the metal oxide 431 is large and the thickness of the metal oxide 433 is small. For example, the metal oxide 431 has a region with a thickness of greater than or equal to 10 nm, preferably greater than or equal to 20 nm, more preferably greater than or equal to 40 nm, still more preferably greater than or equal to 60 nm. An increase in the thickness of the metal oxide 431 can increase the distance from the interface between the adjacent insulator and the metal oxide 431 to the metal oxide 432 where a channel is formed. Note that the metal oxide 431 has a region with a thickness of, for example, less than or equal to 200 nm, preferably less than or equal to 120 nm, more preferably less than or equal to 80 nm, otherwise the productivity of the semiconductor device might be decreased.

For example, a region in which the concentration of silicon is higher than or equal to $1\times10^{16}$ atoms/cm$^3$ and lower than $1\times10^{19}$ atoms/cm$^3$ is provided between the metal oxides 432 and 431. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. A region in which the concentration of silicon is higher than or equal to $1\times10^{16}$ atoms/cm$^3$ and lower than $1\times10^{19}$ atoms/cm$^3$ is provided between the metal oxides 432 and 433. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. The concentration of silicon can be measured by SIMS.

It is preferable to reduce the concentration of hydrogen in the metal oxides 431 and 433 in order to reduce the concentration of hydrogen in the metal oxide 432. The metal oxides 431 and 433 each have a region in which the concentration of hydrogen is higher than or equal to $1\times10^{16}$ atoms/cm$^3$ and lower than or equal to $2\times10^{20}$ atoms/cm$^3$. The concentration of hydrogen is preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. The concentration of hydrogen can be measured by SIMS. It is also preferable to reduce the concentration of nitrogen in the metal oxides 431 and 433 in order to reduce the concentration of nitrogen in the metal oxide 432. The metal oxides 431 and 433 each have a region in which the concentration of nitrogen is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$. The concentration of nitrogen can be measured by SIMS.

The metal oxides 431 to 433 may be formed by a sputtering method, a chemical vapor deposition (CVD) method, a molecular beam epitaxy (MBE) method, a pulsed laser deposition (PLD) method, an atomic layer deposition (ALD) method, or the like.

After the metal oxides 431 and 432 are formed, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The crystallinity of the metal oxides 431 and 432 can be increased by the first heat treatment. Furthermore, impurities such as hydrogen and water can be removed by the first heat treatment.

The above three-layer structure is an example. For example, a two-layer structure without the metal oxide 431 or 433 may be employed. Alternatively, any one of the semiconductors shown as examples of the metal oxides 431 to 433 may be provided over or below the metal oxide 431 or over or below the metal oxide 433, i.e., a four-layer structure may be employed. Further alternatively, an n-layer structure (n is an integer of 5 or more) in which any one of the semiconductors shown as examples of the metal oxides 431 to 433 is provided at two or more of the following positions may be employed: over the metal oxide 431, below the metal oxide 431, over the metal oxide 433, and below the metal oxide 433.

<<Substrate>>

As the substrate 450, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. The semiconductor substrate may be a silicon on insulator (SOI) substrate in which an insulating region is provided in the above semiconductor substrate. Examples of the conductor substrate include a graphite substrate, a metal substrate, an alloy substrate, and a conductive resin substrate. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. Examples of the element provided over the substrate include a capacitor, a resistor, a switching element, a light-emitting element, and a memory element.

A flexible substrate may be used as the substrate 450. As a method for providing a transistor over a flexible substrate, there is a method in which a transistor is formed over a non-flexible substrate, and then the transistor is separated and transferred to the substrate 450 that is a flexible substrate. In that case, a separation layer is preferably provided between the non-flexible substrate and the transistor. As the substrate 450, a sheet, a film, or foil containing a fiber may be used. The substrate 450 may have elasticity. The substrate 450 may have a property of returning to its original shape when bending or pulling is stopped. Alternatively, the substrate 450 may have a property of not returning to its original shape. The thickness of the substrate 450 is, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 450 has small thickness, the weight of the semiconductor device can be reduced. When the substrate 450 has small thickness, even in the case of using glass or the like, the substrate 450 may have elasticity or a property of returning to its original shape when bending or pulling is stopped. Therefore, an impact applied to the semiconductor device over the substrate 450, which is caused by dropping or the like, can be reduced. That is, a durable semiconductor device can be provided.

For the flexible substrate 450, metal, an alloy, a resin, glass, or fiber thereof can be used, for example. The flexible substrate 450 preferably has a lower coefficient of linear expansion because deformation due to an environment is suppressed. The flexible substrate 450 is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 450 because of its low coefficient of linear expansion.

<<Base Insulating Film>>

The insulating film 401 has a function of electrically isolating the substrate 450 from the conductive film 414.

The insulating film 401 or 402 is formed using an insulating film having a single-layer structure or a layered structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 402 may be formed using silicon oxide with high step coverage which is formed by reacting tetraethyl orthosilicate (TEOS), silane, or the like with oxygen, nitrous oxide, or the like.

After the insulating film 402 is formed, the insulating film 402 may be subjected to planarization treatment using a CMP method or the like to improve the planarity of the top surface thereof.

The insulating film 404 preferably contains an oxide. In particular, the insulating film 404 preferably contains an oxide material from which part of oxygen is released by heating. The insulating film 404 preferably contains an oxide containing oxygen more than that in the stoichiometric composition. Part of oxygen is released by heating from an oxide film containing oxygen more than that in the stoichiometric composition. Oxygen released from the insulating film 404 is supplied to the metal oxide 430, so that oxygen vacancies in the metal oxide 430 can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating film 404 preferably contains an oxide that can supply oxygen to the metal oxide 430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 404.

To make the insulating film 404 contain excess oxygen, the insulating film 404 is formed in an oxygen atmosphere, for example. Alternatively, a region containing excess oxygen may be formed by introducing oxygen into the insulating film 404 that has been formed. Both the methods may be combined.

For example, oxygen (at least including any of oxygen radicals, oxygen atoms, and oxygen ions) may be introduced into the insulating film 404 that has been formed, so that a region containing excess oxygen is formed. Oxygen can be introduced by, for example, an ion implantation method, an ion doping method, a plasma immersion ion implantation method, plasma treatment, or the like.

A gas containing oxygen can be used for oxygen introducing treatment. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulating film 404 is formed, the insulating film 404 may be subjected to planarization treatment using a CMP method or the like to improve the planarity of the top surface thereof.

The insulating film 403 has a passivation function of preventing oxygen contained in the insulating film 404 from decreasing by bonding to metal contained in the conductive film 414.

The insulating film 403 has a function of blocking oxygen, hydrogen, water, alkali metal, alkaline earth metal, and the like. Providing the insulating film 403 can prevent outward diffusion of oxygen from the metal oxide 430 and entry of hydrogen, water, or the like into the metal oxide 430 from the outside.

The insulating film 403 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

The threshold voltage of the transistor 400a can be controlled by injecting electrons into a charge trap layer. The charge trap layer is preferably provided in the insulating film 402 or the insulating film 403. For example, when the insulating film 403 is formed using hafnium oxide, aluminum oxide, tantalum oxide, aluminum silicate, or the like, the insulating film 403 can function as a charge trap layer.

<<Gate Electrode>>

The conductive films 411 to 414 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

Alternatively, the conductive films 411 to 414 may be formed using any one of the materials for the metal oxides 431 to 433 described above. Note that the metal oxides 431 to 433 formed under the aforementioned conditions have a function as a semiconductor; therefore, an additional process is necessary so that the metal oxides 431 to 433 can function as a conductor. Specifically, any one of the metal oxides 431 to 433 is formed as the conductive films 411 to 414 and a silicon nitride film is formed as the insulating film 407 by a method using plasma containing hydrogen such as a CVD method, thereby reducing the resistance of the metal oxides 431 to 433. As a result, the metal oxides 431 to 433 function as a conductor and can be used for the conductive films 411 to 414.

<<Source Electrode and Drain Electrode>>

The conductive films 421 to 424 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

The conductive films 421 to 424 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<<Low-Resistance Region>>

The regions 441 and 442 are formed when, for example, the conductive films 421 and 423 take oxygen from the metal oxides 431 and 432. Oxygen is more likely to be extracted at higher temperatures. Oxygen vacancies are formed in the regions 441 and 442 through several heating steps in the manufacturing process of the transistor. In addition, hydrogen enters sites of the oxygen vacancies by heating, increasing the carrier concentration in the regions 441 and 442. As a result, the resistance of the regions 441 and 442 is reduced.

<<Gate Insulating Film>>

The insulating film 406 preferably contains an insulator with a high relative dielectric constant. For example, the insulating film 406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulating film 406 preferably has a layered structure containing silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the layered structure to be thermally stable and have a high relative dielectric constant. For example, when aluminum oxide, gallium oxide, or hafnium oxide is closer to the metal oxide 433, entry of silicon from silicon oxide or silicon oxynitride into the metal oxide 432 can be suppressed.

When silicon oxide or silicon oxynitride is closer to the metal oxide 433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<<Interlayer Insulating Film and Protective Insulating Film>>

The insulating film 405 preferably contains an insulator with a low relative dielectric constant. For example, the insulating film 405 preferably contains silicon oxide, silicon oxynitride, silicon nitride oxide, silicon nitride, or a resin. Alternatively, the insulating film 405 preferably has a layered structure containing silicon oxide or silicon oxynitride and a resin. Because silicon oxide and silicon oxynitride have thermal stability, combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

The insulating film 407 has a function of blocking oxygen, hydrogen, water, alkali metal, alkaline earth metal, and the like. Providing the insulating film 407 can prevent outward diffusion of oxygen from the metal oxide 430 and entry of hydrogen, water, or the like into the metal oxide 430 from the outside.

The insulating film 407 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

An aluminum oxide film is preferably used as the insulating film 407 because it is highly effective in preventing transmission of both oxygen and impurities such as hydrogen and moisture.

When the insulating film 407 is formed by a method using plasma containing oxygen, e.g., by a sputtering method or a CVD method, oxygen can be added to side and top surfaces of the insulating films 405 and 406. It is preferable to perform second heat treatment at any time after the formation of the insulating film 407. Through the second heat treatment, oxygen added to the insulating films 405 and 406 is diffused in the insulating films to reach the metal oxide 430, whereby oxygen vacancies in the metal oxide 430 can be reduced.

Figure 11A:
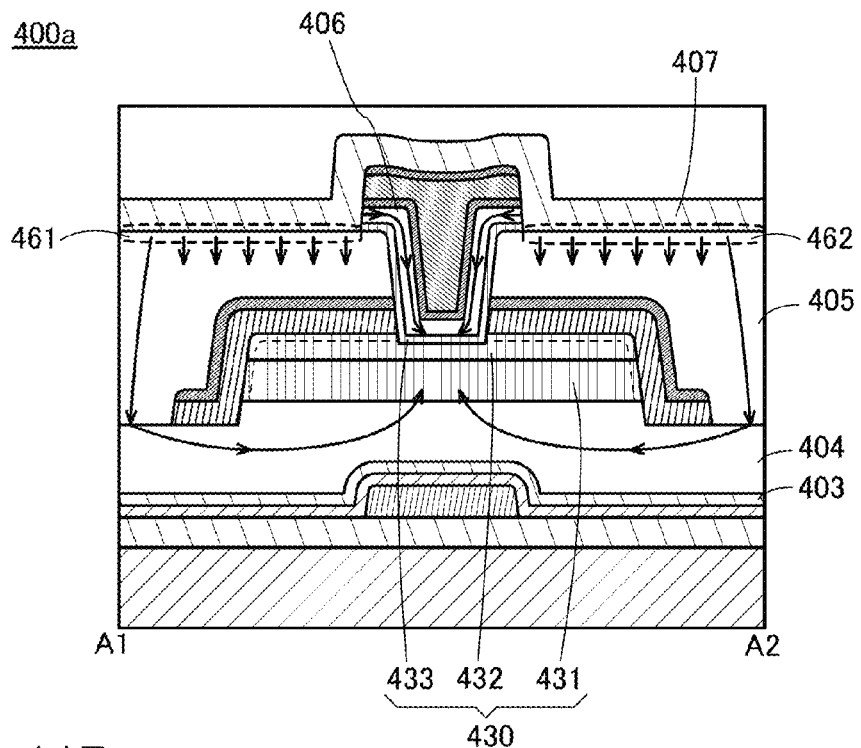
FIGS. 11A and 11B are cross-sectional views showing oxygen diffusion paths.
Figure 11B:
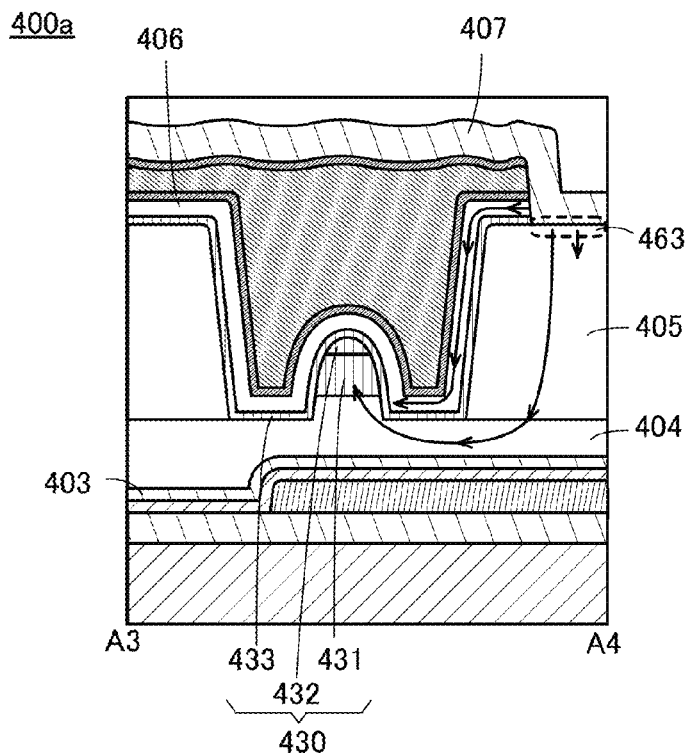

In schematic views of FIGS. 11A and 11B, oxygen added to the insulating films 405 and 406 in the formation of the insulating film 407 is diffused in the insulating films through the second heat treatment and reaches the metal oxide 430. In FIG. 11A, oxygen diffused in the cross-sectional view of FIG. 9B is indicated by arrows. In FIG. 11B, oxygen diffused in the cross-sectional view of FIG. 9C is indicated by arrows.

As shown in FIGS. 11A and 11B, oxygen added to the side surface of the insulating film 406 is diffused in the insulating film 406 and reaches the metal oxide 430. In addition, a region 461, a region 462, and a region 463 each containing excess oxygen are sometimes formed in the vicinity of the interface between the insulating films 407 and 405. Oxygen contained in the regions 461 to 463 reaches the metal oxide 430 through the insulating films 405 and 404. In the case where the insulating film 405 includes silicon oxide and the insulating film 407 includes aluminum oxide, a mixed layer of silicon, aluminum, and oxygen is formed in the regions 461 to 463 in some cases.

The insulating film 407 has a function of blocking oxygen and prevents oxygen from being diffused over the insulating film 407. The insulating film 403 also has a function of blocking oxygen and prevents oxygen from being diffused under the insulating film 403.

Note that the second heat treatment may be performed at a temperature that allows oxygen added to the insulating films 405 and 406 to be diffused to the metal oxide 430. For example, the description of the first heat treatment may be referred to for the second heat treatment. Alternatively, the temperature of the second heat treatment is preferably lower than that of the first heat treatment. The second heat treatment is performed at a temperature lower than that of the first heat treatment by higher than or equal to 20° C. and lower than or equal to 150° C., preferably higher than or equal to 40° C. and lower than or equal to 100° C. Accordingly, superfluous release of oxygen from the insulating film 404 can be inhibited. Note that the second heat treatment is not necessarily performed when heating during formation of the films can work as heat treatment comparable to the second heat treatment.

As described above, oxygen can be supplied to the metal oxide 430 from above and below through the formation of the insulating film 407 and the second heat treatment.

Alternatively, oxygen can be added to the insulating films 405 and 406 by forming a film containing indium oxide, e.g., an In-M-Zn oxide, as the insulating film 407.

The insulating film 408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, for the insulating film 408, a resin such as a polyimide resin, a polyamide resin, an acrylic resin, a siloxane resin, an epoxy resin, or a phenol resin can be used. The insulating film 408 may be a stack including any of the above materials.

<Structure Example 2 of Transistor>

The conductive film 414 and the insulating films 402 and 403 can be omitted in the transistor 400a shown in FIGS. 9A to 9C. An example of such a structure is shown in FIGS. 12A to 12C.

FIGS. 12A to 12C are a top view and cross-sectional views of a transistor 400b. FIG. 12A is a top view. FIG. 12B is a cross-sectional view taken along dashed-dotted line A1-A2 in FIG. 12A and FIG. 12C is a cross-sectional view taken along dashed-dotted line A3-A4 in FIG. 12A. Note that for simplification of the drawing, some components are not illustrated in the top view in FIG. 12A. Note that the dashed-dotted line A1-A2 and the dashed-dotted line A3-A4 are sometimes referred to as a channel length direction of the transistor 400*b* and a channel width direction of the transistor 400*b*, respectively.

<Structure Example 3 of Transistor>

In the transistor 400*a* shown in FIGS. 9A to 9C, parts of the conductive films 421 and 423 that overlap with the gate electrode (the conductive films 411 to 413) can be reduced in thickness. An example of such a structure is shown in FIGS. 13A to 13C.

Figure 13A:
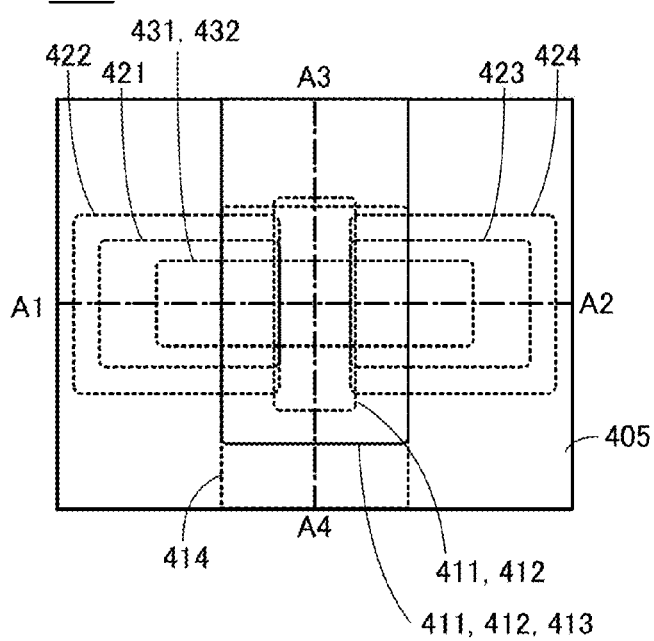
FIGS. 13A to 13C are a top view and cross-sectional views showing a structure example of a transistor.
Figure 13B:
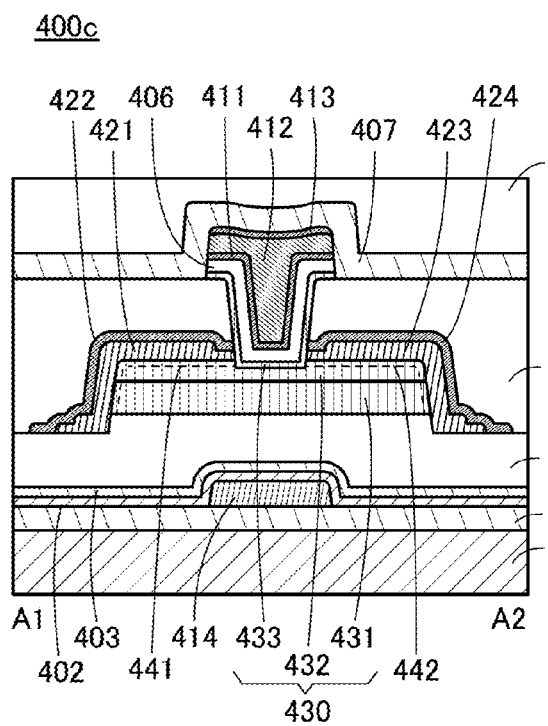
Figure 13C:
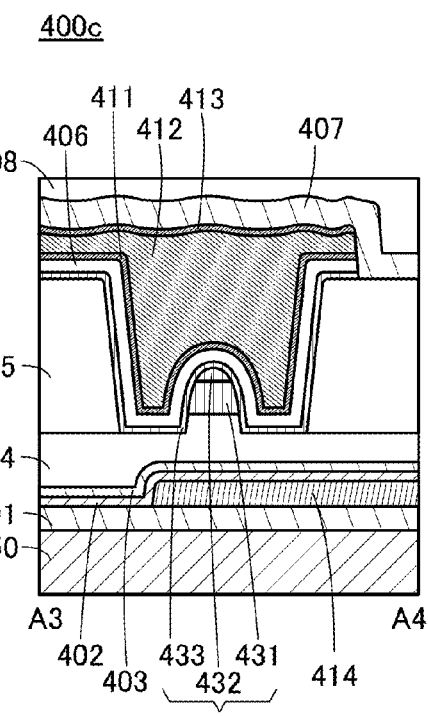

FIGS. 13A to 13C are a top view and cross-sectional views of a transistor 400*c*. FIG. 13A is a top view. FIG. 13B is a cross-sectional view taken along dashed-dotted line A1-A2 in FIG. 13A and FIG. 13C is a cross-sectional view taken along dashed-dotted line A3-A4 in FIG. 13A. Note that for simplification of the drawing, some components are not illustrated in the top view in FIG. 13A. Note that the dashed-dotted line A1-A2 and the dashed-dotted line A3-A4 are sometimes referred to as a channel length direction of the transistor 400*c* and a channel width direction of the transistor 400*c*, respectively.

In the transistor 400*c* shown in FIG. 13B, part of the conductive film 421 that overlaps with the gate electrode is reduced in thickness, and the conductive film 422 covers the conductive film 421. Part of the conductive film 423 that overlaps with the gate electrode is also reduced in thickness, and the conductive film 424 covers the conductive film 423.

The transistor 400*c*, which has the structure shown in FIG. 13B, can have an increased distance between the gate and source electrodes or between the gate and drain electrodes. This results in a reduction in the parasitic capacitance formed between the gate electrode and the source and drain electrodes. As a result, a transistor capable of high-speed operation can be obtained.

<Structure Example 4 of Transistor>

In the transistor 400*c* shown in FIGS. 13A to 13C, the width of the metal oxides 431 and 432 can be increased in the A3-A4 direction. An example of such a structure is shown in FIGS. 14A to 14C.

Figure 14A:
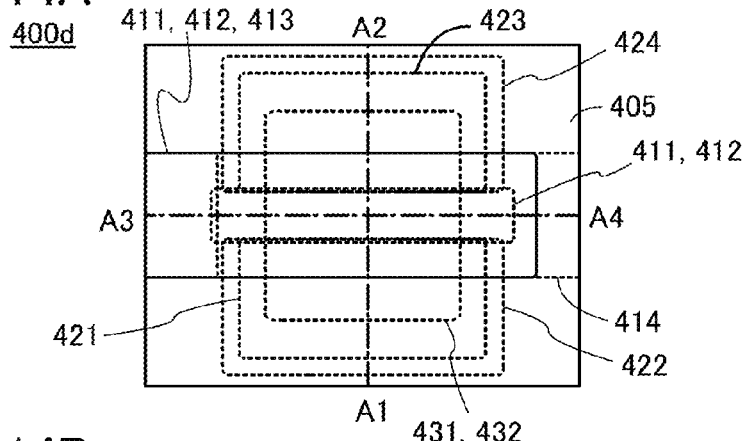
FIGS. 14A to 14C are a top view and cross-sectional views showing a structure example of a transistor.
Figure 14B:
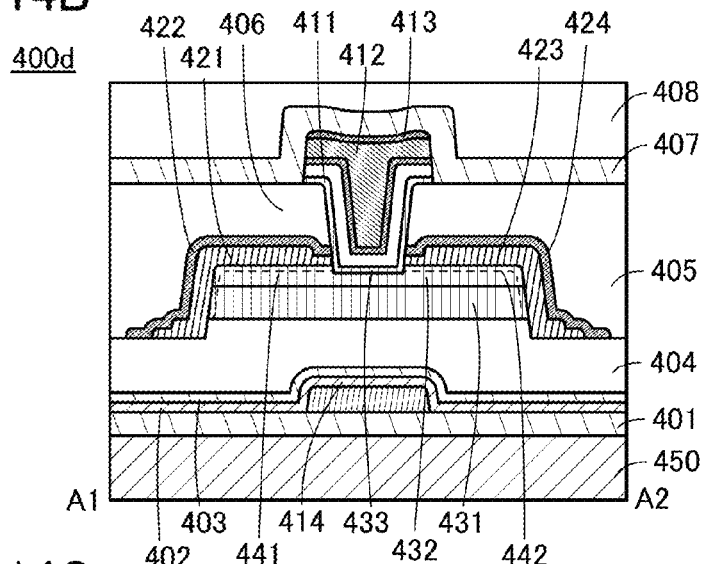
Figure 14C:
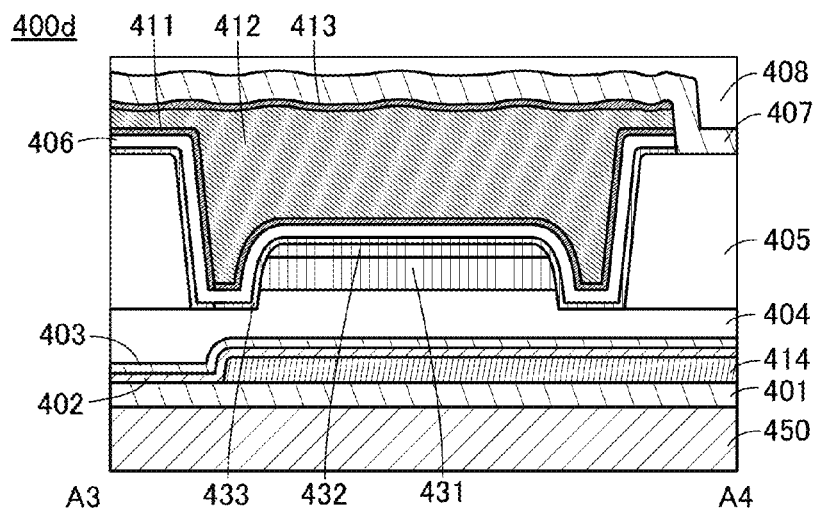

FIGS. 14A to 14C are a top view and cross-sectional views of a transistor 400*d*. FIG. 14A is a top view. FIG. 14B is a cross-sectional view taken along dashed-dotted line A1-A2 in FIG. 14A and FIG. 14C is a cross-sectional view taken along dashed-dotted line A3-A4 in FIG. 14A. Note that for simplification of the drawing, some components are not illustrated in the top view in FIG. 14A. Note that the dashed-dotted line A1-A2 and the dashed-dotted line A3-A4 are sometimes referred to as a channel length direction of the transistor 400*d* and a channel width direction of the transistor 400*d*, respectively.

The transistor 400*d*, which has the structure shown in FIGS. 14A to 14C, can have an increased on-state current.

<Structure Example 5 of Transistor>

In the transistor 400*c* shown in FIGS. 13A to 13C, a plurality of regions (hereinafter referred to as fins) consisting of the metal oxides 431 and 432 may be provided in the A3-A4 direction. An example of such a structure is shown in FIGS. 15A to 15C.

Figure 15A:
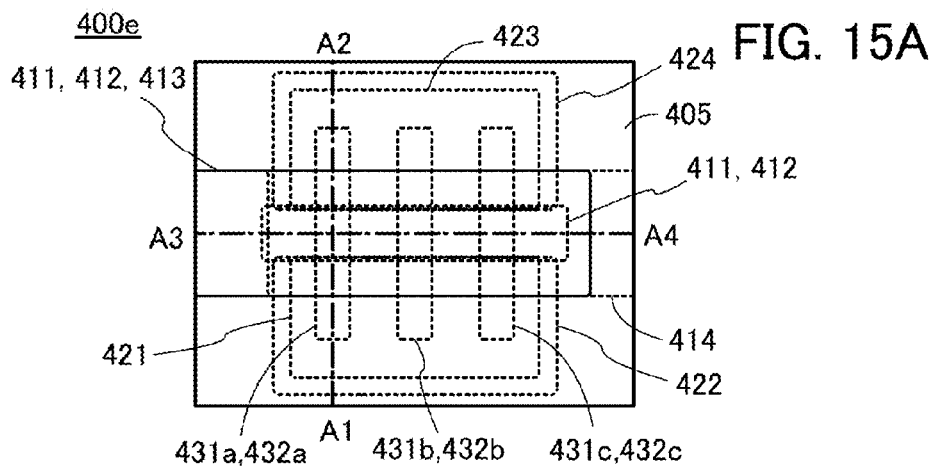
FIGS. 15A to 15C are a top view and cross-sectional views showing a structure example of a transistor.
Figure 15B:
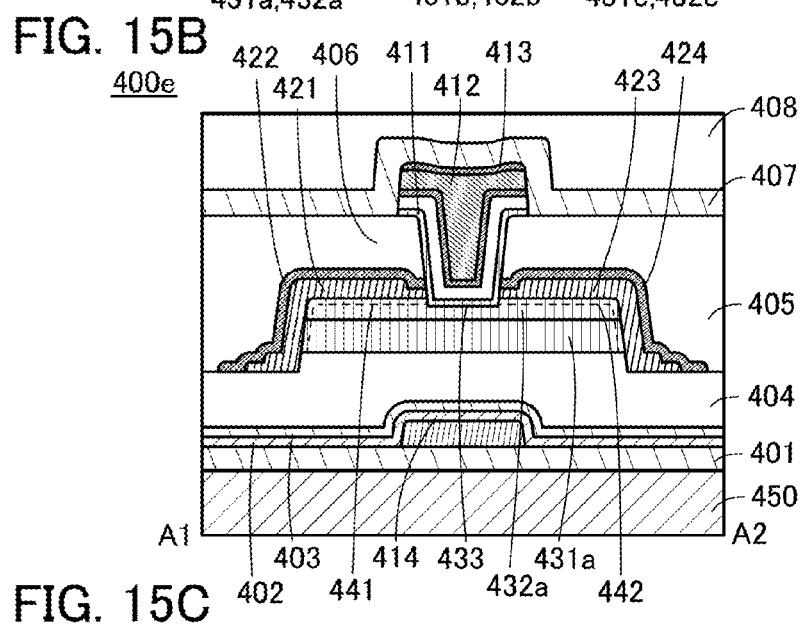
Figure 15C:
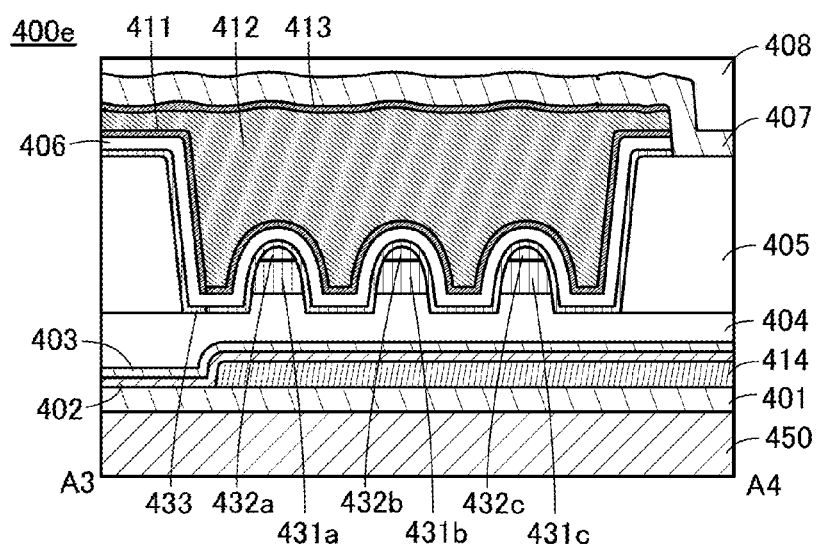

FIGS. 15A to 15C are a top view and cross-sectional views of a transistor 400*e*. FIG. 15A is a top view. FIG. 15B is a cross-sectional view taken along dashed-dotted line A1-A2 in FIG. 15A and FIG. 15C is a cross-sectional view taken along dashed-dotted line A3-A4 in FIG. 15A. Note that for simplification of the drawing, some components are not illustrated in the top view in FIG. 15A. Note that the dashed-dotted line A1-A2 and the dashed-dotted line A3-A4 are sometimes referred to as a channel length direction of the transistor 400*e* and a channel width direction of the transistor 400*e*, respectively.

The transistor 400*e* includes a first fin consisting of metal oxides 431*a* and 432*a*, a second fin consisting of metal oxides 431*b* and 432*b*, and a third fin consisting of metal oxides 431*c* and 432*c*.

In the transistor 400*e*, the metal oxides 432*a* to 432*c* where a channel is formed are surrounded by the gate electrode. Hence, a gate electric field can be applied to the entire channel, so that a transistor with a high on-state current can be obtained.

<Structure Example 6 of Transistor>

Figure 16A:
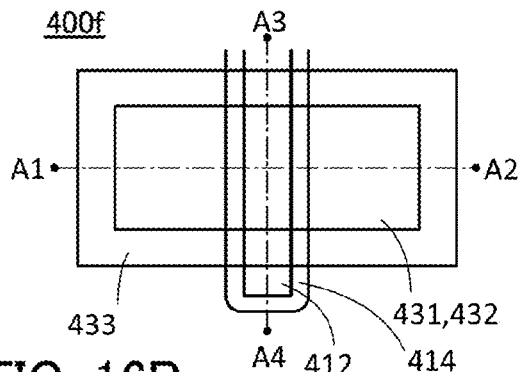
FIGS. 16A to 16D are a top view and cross-sectional views showing a structure example of a transistor.
Figure 16B:
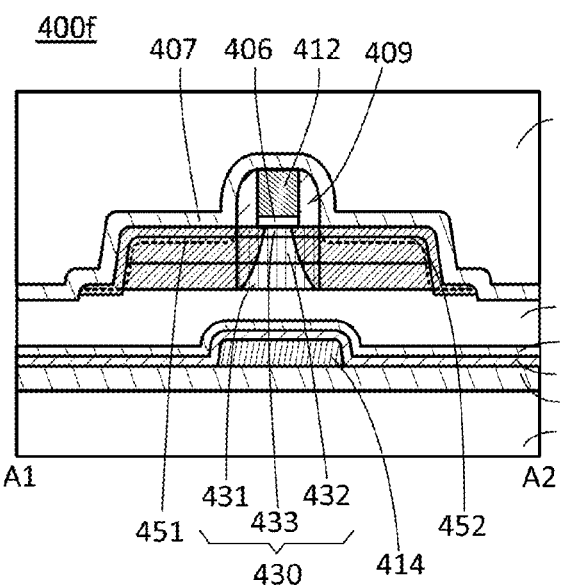
Figure 16C:
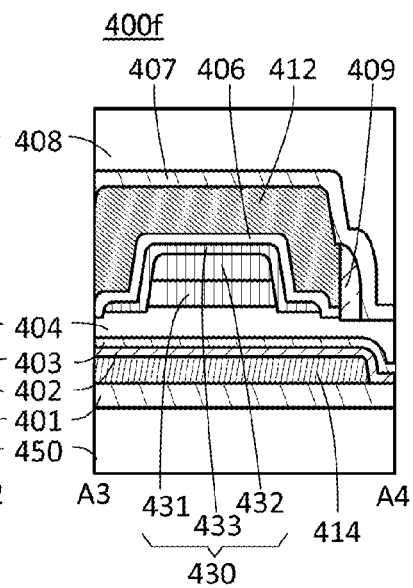

FIGS. 16A to 16D are a top view and cross-sectional views of a transistor 400*f*. FIG. 16A is a top view of the transistor 400*f*. FIG. 16B is a cross-sectional view taken along dashed-dotted line A1-A2 in FIG. 16A and FIG. 16C is a cross-sectional view taken along dashed-dotted line A3-A4 in FIG. 16A. Note that the dashed-dotted line A1-A2 and the dashed-dotted line A3-A4 are sometimes referred to as a channel length direction and a channel width direction, respectively. The transistor 400*f* has the s-channel structure as the transistor 400*a* and the like. In the transistor 400*f*, an insulating film 409 is provided in contact with the side surface of the conductive film 412 used as a gate electrode. The insulating film 409 and the conductive film 412 are covered with an insulating film 407. The insulating film 407 is covered with the insulating film 408. The insulating film 409 serves as a sidewall insulator of the transistor 400*f*. As in the transistor 400*a*, the gate electrode may be a stack of the conductive films 411 to 413. Alternatively, as described in Structure example 1 of transistor, any one of the metal oxides 431 to 433 may be used as the conductive films 411 to 413 of the gate electrode. In that case, the treatment described in detail for the gate electrode of Structure example 1 of transistor needs to be performed so that the metal oxides 431 to 433 can function as a conductor.

The insulating film 406 and the conductive film 412 overlap with the conductive film 414 and the metal oxide 432 at least partly. The side edge of the conductive film 412 in the channel length direction is preferably approximately aligned with the side edge of the insulating film 406 in the channel length direction. Here, the insulating film 406 serves as a gate insulator of the transistor 400*f*, the conductive film 412 serves as a gate electrode of the transistor 400*f*, and the insulating film 409 serves as a sidewall insulator of the transistor 400*f*.

The metal oxide 432 has a region that overlaps with the conductive film 412 with the metal oxide 433 and the insulating film 406 positioned therebetween. Preferably, the outer edge of the metal oxide 431 is approximately aligned with the outer edge of the metal oxide 432, and the outer edge of the metal oxide 433 is outside of the outer edges of the metal oxides 431 and 432. However, the shape of the transistor in this embodiment is not limited to that where the outer edge of the metal oxide 433 is outside of the outer edge of the metal oxide 431. For example, the outer edge of the metal oxide 431 may be outside of the outer edge of the metal oxide 433, or the side edge of the metal oxide 431 may be approximately aligned with the side edge of the metal oxide 433.

Figure 16D:
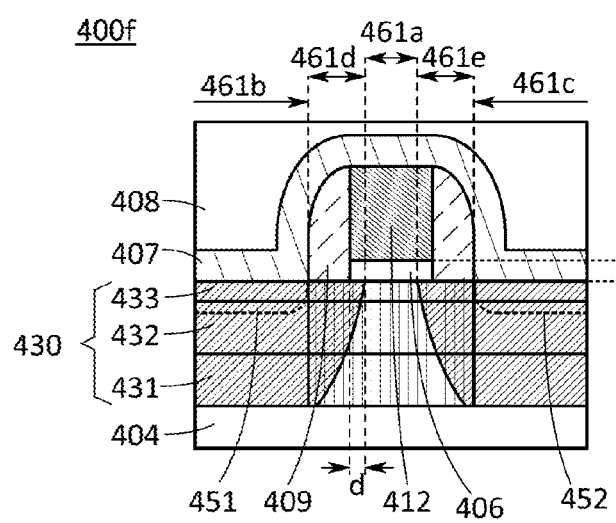

FIG. 16D is an enlarged view of part of FIG. 16B. As shown in FIG. 16D, regions 461*a* to 461*e* are formed in the metal oxide 430. The regions 461*b* to 461*e* have a higher concentration of dopant and therefore have a lower resistance than the region 461*a*. Furthermore, the regions 461*b* and 461*c* have a higher concentration of hydrogen and therefore have a much lower resistance than the regions 461d and 461e. The concentration of a dopant in the region 461a is, for example, less than or equal to 5%, less than or equal to 2%, or less than or equal to 1% of the maximum concentration of a dopant in the region 461b or 461c. Note that the dopant may be rephrased as a donor, an acceptor, an impurity, or an element.

As shown in FIG. 16D, in the metal oxide 430, the region 461a substantially overlaps with the conductive film 412, and the regions 461b to 461e are the regions other than the region 461a. In the regions 461b and 461c, the top surface of the metal oxide 433 is in contact with the insulating film 407. In the regions 461d and 461e, the top surface of the metal oxide 433 is in contact with the insulating film 409 or 406. That is, as shown in FIG. 16D, the border between the regions 461b and 461d overlaps with the border between the side edges of the insulating films 407 and 409. The same applies to the border between the regions 461c and 461e. Here, part of the regions 461d and 461e preferably overlaps with part of a region (a channel formation region) where the metal oxide 432 and the conductive film 412 overlap with each other. For example, preferably, the side edges of the regions 461d and 461e in the channel length direction are inside of the conductive film 412 and the distance between the side edge of the conductive film 412 and each of the side edges of the regions 461d and 461e is d. In that case, the thickness $t_{406}$ of the insulating film 406 and the distance d preferably satisfy $0.25 t_{406} < d < t_{406}$.

In the above manner, the regions 461d and 461e are formed in part of the region where the metal oxide 430 and the conductive film 412 overlap with each other. Accordingly, the channel formation region of the transistor 400f is in contact with the low-resistance regions 461d and 461e and a high-resistance offset region is not formed between the region 461a and each of the regions 461d and 461e, so that the on-state current of the transistor 400f can be increased. Furthermore, since the side edges of the regions 461d and 461e in the channel length direction are formed so as to satisfy the above range, the regions 461d and 461e can be prevented from being formed too deeply in the channel formation region and always conducted.

The regions 461b to 461e are formed by ion doping treatment such as an ion implantation method. Therefore, as shown in FIG. 16D, the boundary between the regions 461d and 461a sometimes gets closer to the boundary between the regions 461d and 461b with the depth in the direction from the top surface of the metal oxide 433 to the bottom surface of the metal oxide 431. The distance d in that case is the distance between the boundary between the regions 461d and 461a which is closest to the inner part of the conductive film 412 in the direction of the dashed-dotted line A1-A2 and the side edge of the conductive film 412 at A1 side in the direction of the dashed-dotted line A1-A2. Also, the boundary between the regions 461e and 461a sometimes gets closer to the boundary between the regions 461e and 461c with the depth in the direction from the top surface of the metal oxide 433 to the bottom surface of the metal oxide 431. The distance d in that case is the distance between the boundary between the regions 461e and 461a which is closest to the inner part of the conductive film 412 in the direction of the dashed-dotted line A1-A2 and the side edge of the conductive film 412 at A2 side in the direction of the dashed-dotted line A1-A2.

In some cases, for example, the regions 461d and 461e in the metal oxide 431 do not overlap with the conductive film 412. In that case, at least part of the regions 461d and 461e in the metal oxide 431 or 432 is preferably formed in a region overlapping with the conductive film 412.

In addition, low-resistance regions 451 and 452 are preferably formed in metal oxide 431, the metal oxide 432, and the metal oxide 433 in the vicinity of the interface with the insulating film 407. The low-resistance regions 451 and 452 contain at least one of elements included in the insulating film 407. Preferably, part of the low-resistance regions 451 and 452 is substantially in contact with or overlaps partly with the region (the channel formation region) where the metal oxide 432 and the conductive film 412 overlap with each other.

Since a large part of the metal oxide 433 is in contact with the insulating film 407, the low-resistance regions 451 and 452 are likely to be formed in the metal oxide 433. The low-resistance regions 451 and 452 in the metal oxide 433 contain a higher concentration of elements included in the insulating film 407 than the other regions of the metal oxide 433 (e.g., the region of the metal oxide 433 that overlaps with the conductive film 412).

The low-resistance regions 451 and 452 are formed in the regions 461b and 461c, respectively. Ideally, the metal oxide 430 has a structure in which the concentration of added elements is the highest in the low-resistance regions 451 and 452, the second highest in the regions 461b and 461c other than the low-resistance regions 451 and 452, and the lowest in the region 461a. The added elements refer to a dopant for forming the regions 461b and 461c and an element added from the insulating film 407 to the low-resistance regions 451 and 452.

Although the low-resistance regions 451 and 452 are formed in the transistor 400f, the semiconductor device shown in this embodiment is not limited to this structure. For example, the low-resistance regions 451 and 452 are not necessarily formed in the case where the regions 461b and 461c have a sufficiently low resistance.

<Structure Example 7 of Transistor>

Figure 17A:
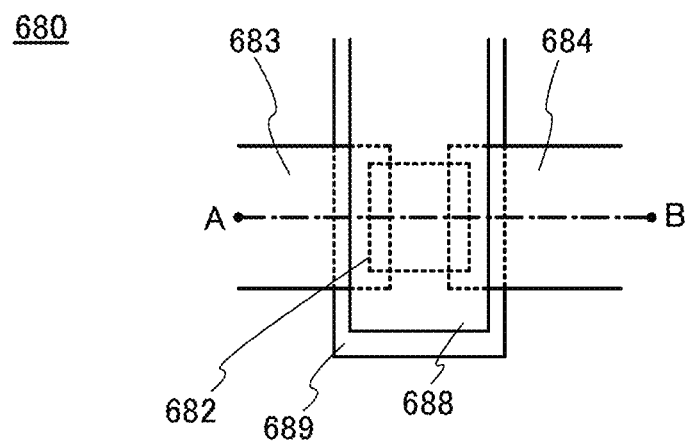
FIGS. 17A and 17B are a top view and a cross-sectional view showing a structural example of a transistor.
Figure 17B:
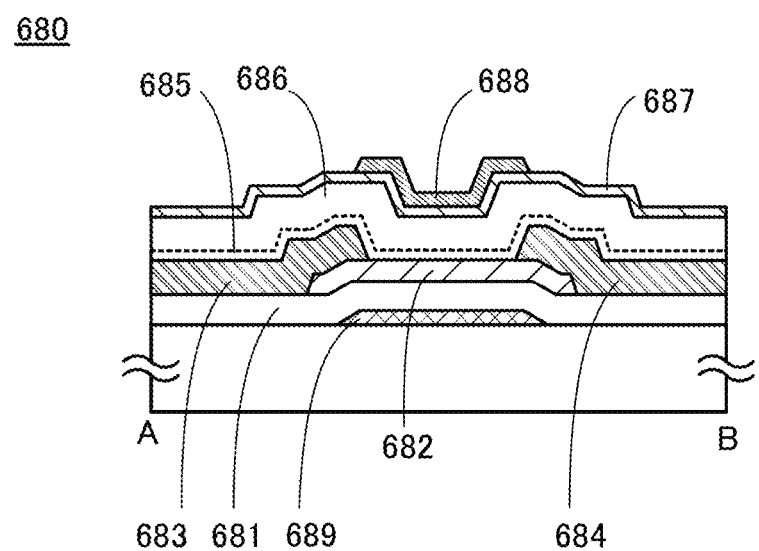

FIGS. 17A and 17B are a top view and a cross-sectional views of a transistor 680. FIG. 17A is a top view, and FIG. 17B is a cross-sectional view taken along dashed-dotted line A-B in FIG. 17A. Note that for simplification of the drawing, some components are increased or reduced in size, or omitted in FIGS. 17A and 17B. Note that the dashed-dotted line A-B is sometimes referred to as a channel length direction.

The transistor 680 shown in FIG. 17B includes a conductive film 689 serving as a first gate, a conductive film 688 serving as a second gate, a semiconductor 682, a conductive film 683 and a conductive film 684 serving as a source and a drain, an insulating film 681, an insulating film 685, an insulating film 686, and an insulating film 687.

The conductive film 689 is on an insulating surface. The conductive film 689 overlaps with the semiconductor 682 with the insulating film 681 provided therebetween. The conductive film 688 overlaps with the semiconductor 682 with the insulating films 685, 686, and 687 provided therebetween. The conductive films 683 and 684 are connected to the semiconductor 682.

The description of the conductive films 411 to 414 in FIGS. 9A to 9C can be referred to for the details of the conductive films 689 and 688.

The conductive films 689 and 688 may be supplied with different potentials, or may be supplied with the same potential at the same time. The conductive film 688 serving as a second gate electrode in the transistor 680 leads to stabilization of threshold voltage. Note that the conductive film 688 is unnecessary in some cases.

The description of the metal oxide 432 in FIGS. 9A to 9C can be referred to for the details of the semiconductor 682. The semiconductor 682 may be a single layer or a stack including a plurality of semiconductor layers.

The description of the conductive films 421 to 424 in FIGS. 9A to 9C can be referred to for the details of the conductive films 683 and 684.

The description of the insulating film 406 in FIGS. 9A to 9C can be referred to for the details of the insulating film 681.

The insulating films 685 to 687 are sequentially stacked over the semiconductor 682 and the conductive films 683 and 684 in FIG. 17B; however, an insulating film provided over the semiconductor 682 and the conductive films 683 and 684 may be a single layer or a stack including a plurality of insulating films.

In the case of using an oxide semiconductor as the semiconductor 682, the insulating film 686 preferably contains oxygen at a proportion higher than or equal to that in the stoichiometric composition and has a function of supplying part of oxygen to the semiconductor 682 by heating. Note that in the case where the provision of the insulating film 686 directly on the semiconductor 682 causes damage to the semiconductor 682 at the time of formation of the insulating film 686, the insulating film 685 is preferably provided between the semiconductor 682 and the insulating film 686, as shown in FIG. 17B. The insulating film 685 preferably allows oxygen to pass therethrough, and causes little damage to the semiconductor 682 when the insulating film 685 is formed compared with the case of the insulating film 686. If the insulating film 686 can be formed directly on the semiconductor 682 while damage to the semiconductor 682 is reduced, the insulating film 685 is not necessarily provided.

For the insulating films 685 and 686, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 687 preferably has an effect of blocking diffusion of oxygen, hydrogen, and water. Alternatively, the insulating film 687 preferably has an effect of blocking diffusion of hydrogen and water.

As an insulating film has higher density and becomes denser or has a fewer dangling bonds and becomes more chemically stable, the insulating film has a more excellent blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 687 has an effect of blocking diffusion of water, hydrogen, and the like, impurities such as water and hydrogen that exist in a resin in a panel or exist outside the panel can be prevented from entering the semiconductor 682. In the case where an oxide semiconductor is used as the semiconductor 682, part of water or hydrogen that enters the oxide semiconductor serves as an electron donor (donor). Thus, the use of the insulating film 687 having the blocking effect can prevent a shift in the threshold voltage of the transistor 680 due to generation of donors.

In addition, in the case where an oxide semiconductor is used as the semiconductor 682, the insulating film 687 has an effect of blocking diffusion of oxygen, so that diffusion of oxygen from the oxide semiconductor to the outside can be prevented. Accordingly, oxygen vacancies in the oxide semiconductor that serve as donors are reduced, so that a shift in the threshold voltage of the transistor 680 due to generation of donors can be prevented.

Note that this embodiment can be combined with any of the other embodiments in this specification as appropriate.

Embodiment 4

In this embodiment, configuration examples of a device that can be applied to the memory cells 210, 220, 230, and 240 (hereinafter collectively referred to as the memory cell 200[i,j]) shown in the above embodiments will be described with reference to FIGS. 18A to 21B.

<<Chip Configuration Example 1>>

FIGS. 18A and 18B are cross-sectional views showing an example in which the memory cell 200[i,j] is formed in one chip. FIG. 18A shows a cross section in a channel length direction of transistors included in the memory cell 200[i,j], and FIG. 18B shows a cross section in a channel width direction of the transistors included in the memory cell 200[i,j].

The memory cell 200[i,j] shown in FIGS. 18A and 18B includes layers L1, L2, L3, L4, L5, L6, L7, L8, L9, L10, L11, and L12 in order from the bottom.

The layer L1 includes a substrate 700, a transistor Tr0 formed using the substrate 700, an element isolation layer 701, and a plurality of conductors such as a conductor 710 and a conductor 711.

The layer L2 includes a plurality of wirings such as a wiring 730 and a wiring 731.

The layer L3 includes a plurality of conductors such as a conductor 712 and a conductor 713 and a plurality of wirings (not shown).

The layer L4 includes an insulator 706, a transistor Tr1, an insulator 702, an insulator 703, and a plurality of conductors such as a conductor 714 and a conductor 715.

The layer L5 includes a plurality of wirings such as a wiring 732 and a wiring 733.

The layer L6 includes a plurality of conductors such as a conductor 716.

The layer L7 includes a transistor Tr2, an insulator 704, an insulator 705, and a plurality of conductors such as a conductor 717.

The layer L8 includes a plurality of wirings such as a wiring 734 and a wiring 735.

The layer L9 includes a plurality of conductors such as a conductor 718 and a plurality of wirings (not shown).

The layer L10 includes a plurality of wirings such as a wiring 736.

The layer L11 includes a capacitor C1 and a plurality of conductors such as a conductor 719. The capacitor C1 includes a first electrode 751, a second electrode 752, and an insulating film 753.

The layer L12 includes a plurality of wirings such as a wiring 737.

The OS transistor shown in Embodiment 3 is preferably used as the transistors Tr1 and Tr2. In FIGS. 18A and 18B, the transistor 400c shown in FIGS. 13A to 13C is used as the transistors Tr1 and Tr2.

The transistor Tr0 is preferably formed using a semiconductor material different from that for the transistors Tr1 and Tr2. In FIGS. 18A and 18B, a Si transistor is used as the transistor Tr0.

As the substrate 700, a single crystal semiconductor substrate or a polycrystalline semiconductor substrate of silicon or silicon carbide, a compound semiconductor substrate of silicon germanium, an SOI substrate, or the like can be used.

For example, a glass substrate, a quartz substrate, a plastic substrate, a metal substrate, a flexible substrate, an attachment film, paper including a fibrous material, or a base film may be used as the substrate 700. Alternatively, a semiconductor element may be formed using one substrate, and then transferred to another substrate. In FIGS. 18A and 18B, as an example, a single crystal silicon wafer is used as the substrate 700.

Figure 20A:
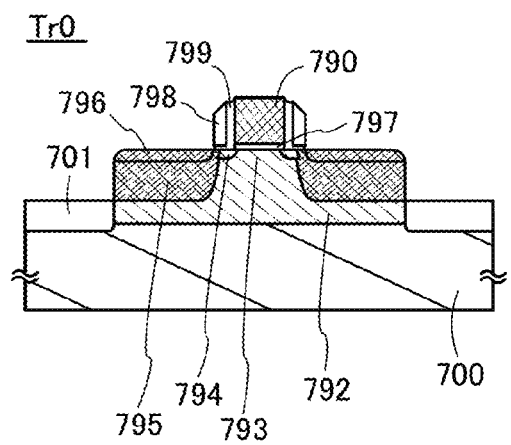
FIGS. 20A and 20B are cross-sectional views showing a structure example of a transistor.
Figure 20B:
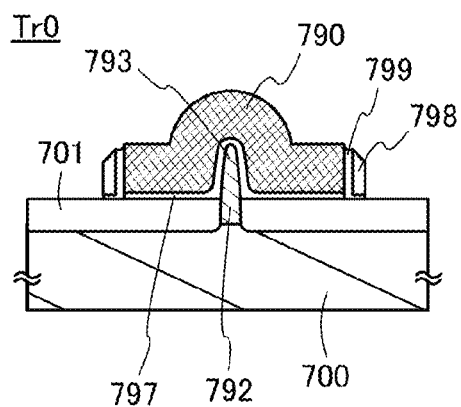

The transistor Tr0 is described in detail with reference to FIGS. 20A and 20B. FIG. 20A is a cross-sectional view of the transistor Tr0 in the channel length direction and FIG. 20B is a cross-sectional view of the transistor Tr0 in the channel width direction. The transistor Tr0 includes a channel formation region 793 formed in a well 792, low concentration impurity regions 794 and high concentration impurity regions 795 (also collectively referred to as an impurity region simply), conductive regions 796 provided in contact with the impurity region, a gate insulating film 797 provided over the channel formation region 793, a gate electrode 790 provided over the gate insulating film 797, and sidewall insulating layers 798 and 799 provided on side surfaces of the gate electrode 790. Note that the conductive regions 796 can be formed using metal silicide or the like.

In the transistor Tr0 in FIG. 20B, the channel formation region 793 has a projecting portion, and the gate insulating film 797 and the gate electrode 790 are provided along side and top surfaces of the channel formation region 793. The transistor with such a shape is referred to as a FIN-type transistor. Although the projecting portion is formed by processing part of the semiconductor substrate in this embodiment, a semiconductor layer with a projecting portion may be formed by processing an SOI substrate.

Figure 21A:
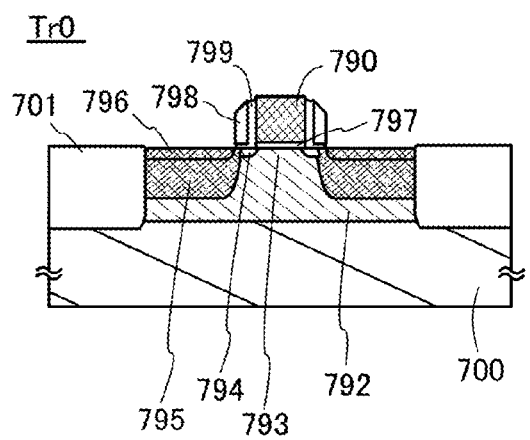
FIGS. 21A and 21B are cross-sectional views showing a structure example of a transistor.
Figure 21B:
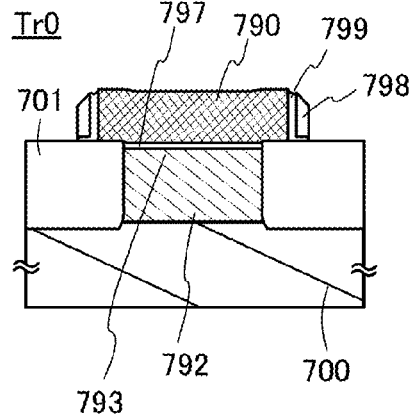

Note that the transistor Tr0 is not limited to the FIN-type transistor, and may be a planar-type transistor shown in FIGS. 21A and 21B. FIG. 21A is a cross-sectional view of the transistor Tr0 in the channel length direction and FIG. 21B is a cross-sectional view of the transistor Tr0 in the channel width direction. The reference numerals in FIGS. 21A and 21B are the same as those shown in FIGS. 20A and 20B.

In FIGS. 18A and 18B, the insulators 702 to 706 preferably have a blocking effect against hydrogen, water, and the like. Water, hydrogen, and the like are factors that generate carriers in an oxide semiconductor; thus, providing such a blocking layer against hydrogen, water, and the like can improve the reliability of the transistors Tr1 and Tr2. Examples of the insulator having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

The wirings 730 to 737 and the conductors 710 to 719 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. It is also preferable to use a low-resistance conductive material such as aluminum or copper. The use of a Cu—Mn alloy is further preferable, in which case manganese oxide formed at the interface with an insulator containing oxygen has a function of preventing Cu diffusion.

In FIGS. 18A and 18B, regions without reference numerals and hatch patterns represent regions formed of an insulator. As the insulator, an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in the regions, an organic resin such as a polyimide resin, a polyamide resin, an acrylic resin, a siloxane resin, an epoxy resin, or a phenol resin can be used. Note that in this specification, an oxynitride refers to a compound that contains more oxygen than nitrogen, and a nitride oxide refers to a compound that contains more nitrogen than oxygen.

In the case where an OS transistor is used as the transistors OSTR2 to OSTR4 shown Embodiment 2, the transistors OSTR2 to OSTR4 are preferably formed in the layer L4 or the layer L7.

In the case where a Si transistor is used as the transistors SiTR1 to SiTR5 shown in Embodiment 2, the transistors SiTR1 to SiTR5 are preferably formed in the layer L1.

In the case where an OS transistor is used as the transistors SiTR1 to SiTR5 shown in Embodiment 2, the transistors SiTR1 to SiTR5 are preferably formed in the layer L4 or L7.

The capacitors MC1 to MC4 shown in Embodiment 1 or 2 are preferably formed in the layer L11.

In the case where a driver circuit around the memory cell 200[$i,j$] is formed using an OS transistor, the OS transistor may be formed in the layer L4 or L7.

In the case where a driver circuit around the memory cell 200[$i,j$] is formed using a Si transistor, the Si transistor may be formed in the layer L1.

With the structure shown in FIGS. 18A and 18B, the area occupied by the memory cell 200[$i,j$] can be reduced, leading to higher integration of the memory cell.

<<Chip Configuration Example 2>>

Figure 19A:
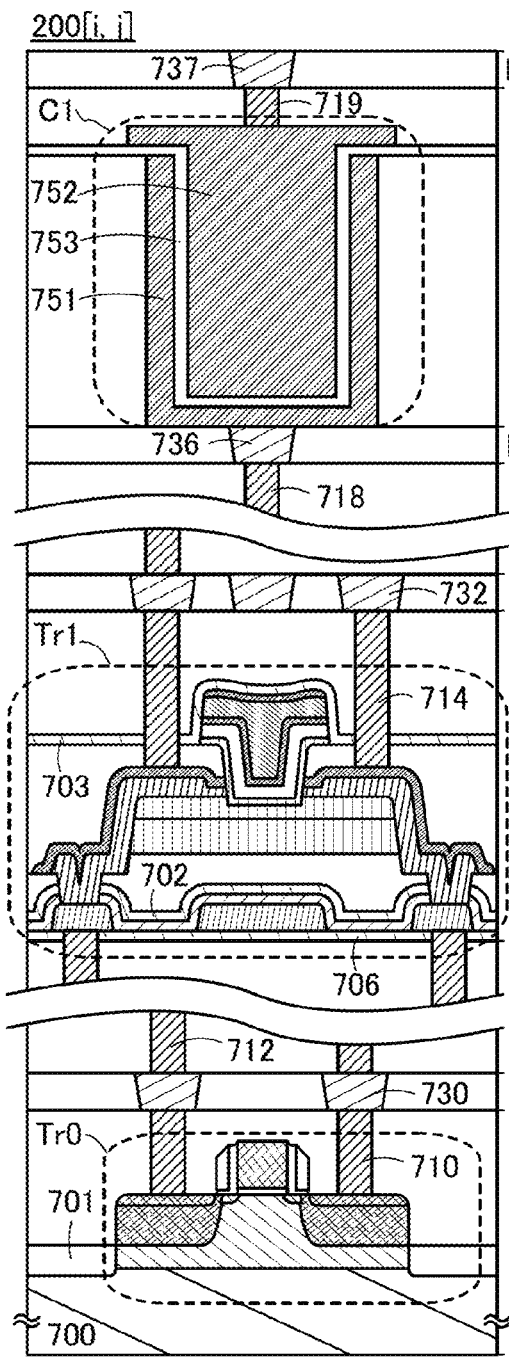
FIGS. 19A and 19B are cross-sectional views showing a configuration example of a memory cell.
Figure 19B:
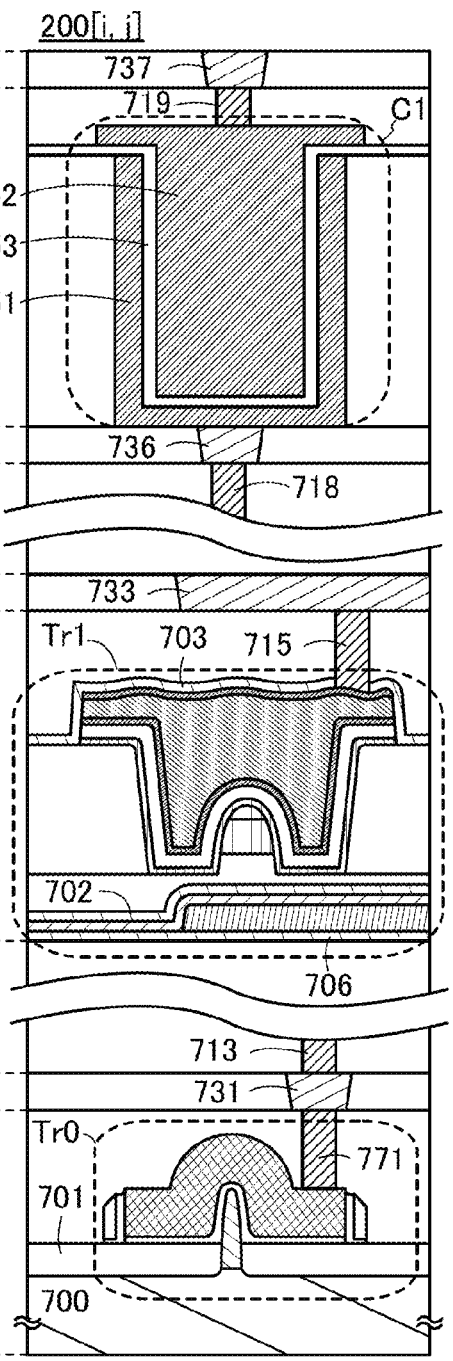

All the OS transistors in the memory cell 200[$i,j$] may be formed in the same layer. An example of such a case is shown in FIGS. 19A and 19B. Similarly to FIGS. 18A and 18B, FIG. 19A shows a cross section in a channel length direction of transistors included in the memory cell 200[$i,j$], and FIG. 19B shows a cross section in a channel width direction of the transistors included in the memory cell 200[$i,j$].

The cross-sectional views of FIGS. 19A and 19B are different from those of FIGS. 18A and 18B in that the layers L6 to L8 are omitted and the layer L9 is formed on the layer L5. For the other details in FIGS. 19A and 19B, the description of FIGS. 18A and 18B is referred to.

In the case where an OS transistor is used as the transistors OSTR1 to OSTR4 shown in Embodiment 1 or 2, the transistors OSTR1 to OSTR4 are preferably formed in the layer L4.

In the case where a Si transistor is used as the transistors SiTR1 to SiTR5 shown in Embodiment 1 or 2, the transistors SiTR1 to SiTR5 are preferably formed in the layer L1.

In the case where an OS transistor is used as the transistors SiTR1 to SiTR5 shown in Embodiment 1 or 2, the transistors SiTR1 to SiTR5 are preferably formed in the layer L4.

The capacitors MC1 to MC4 shown in Embodiment 1 or 2 are preferably formed in the layer L11.

In the case where a driver circuit around the memory cell 200[i,j] is formed using an OS transistor, the OS transistor may be formed in the layer L4.

In the case where a driver circuit around the memory cell 200[i,j] is formed using a Si transistor, the Si transistor may be formed in the layer L1.

With the structure shown in FIGS. 19A and 19B, the production process of the memory cell 200[i,j] can be simplified.

Note that this embodiment can be combined with any of the other embodiments in this specification as appropriate.

Embodiment 5

Described in this embodiment is a CPU in which the memory cell and the memory device described in the above embodiments can be used.

Figure 22:
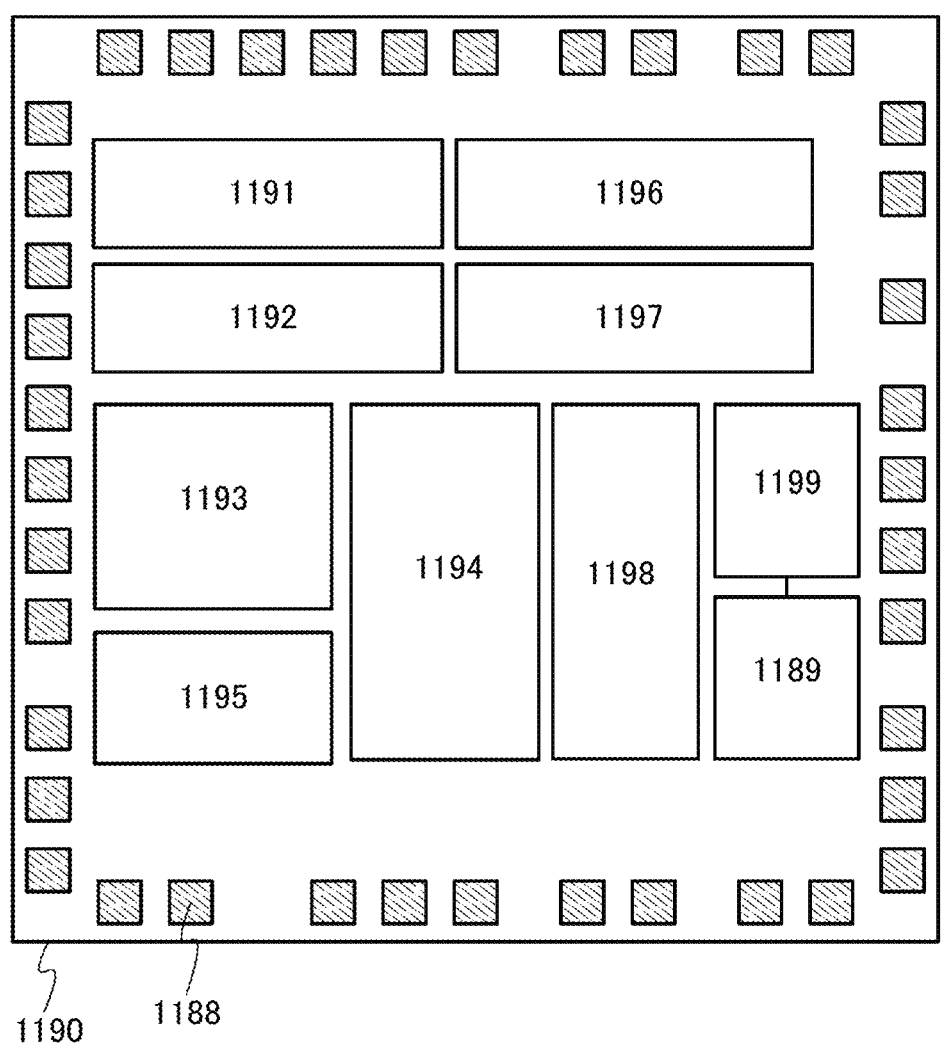
FIG. 22 is a block diagram showing a configuration example of a CPU.

FIG. 22 is a block diagram showing a configuration example of a CPU.

The CPU shown in FIG. 22 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189. Furthermore, a plurality of external connection pads 1188 are provided on the outer edge of the substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 22 is just an example with a simplified configuration, and an actual CPU may have a variety of configurations depending on the application. For example, a CPU may include a plurality of cores each of which includes the CPU shown in FIG. 22 or an arithmetic circuit and which operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

The memory cell described in the above embodiments can be used for the register 1196 in the CPU shown in FIG. 22.

Note that this embodiment can be combined with any of the other embodiments in this specification as appropriate.

Embodiment 6

The memory device of one embodiment of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can include the memory device of one embodiment of the present invention are mobile phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of these electronic devices are illustrated in FIGS. 23A to 23F.

Figure 23A:
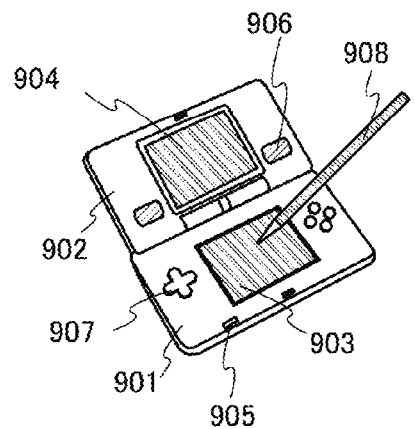
FIGS. 23A to 23F are perspective views illustrating examples of an electronic device.

FIG. 23A illustrates a portable game machine, which includes a housing 901, a housing 902, a display portion 903, a display portion 904, a microphone 905, speakers 906, a control key 907, a stylus 908, and the like. Note that although the portable game machine in FIG. 23A has the two display portions 903 and 904, the number of display portions included in the portable game machine is not limited to this.

Figure 23B:
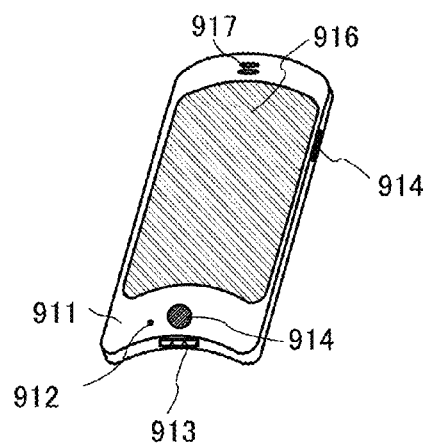

FIG. 23B illustrates a cellular phone, which includes a housing 911, a display portion 916, operation buttons 914, an external connection port 913, a speaker 917, a microphone 912, and the like. When the display portion 916 of the cellular phone illustrated in FIG. 23B is touched with a finger or the like, data can be input. Furthermore, operations such as making a call and inputting a character can be performed by touch on the display portion 916 with a finger or the like. The power can be turned on or off with the operation button 914. In addition, types of images displayed on the display portion 916 can be switched; for example, switching images from a mail creation screen to a main menu screen is performed with the operation button 914.

Figure 23C:
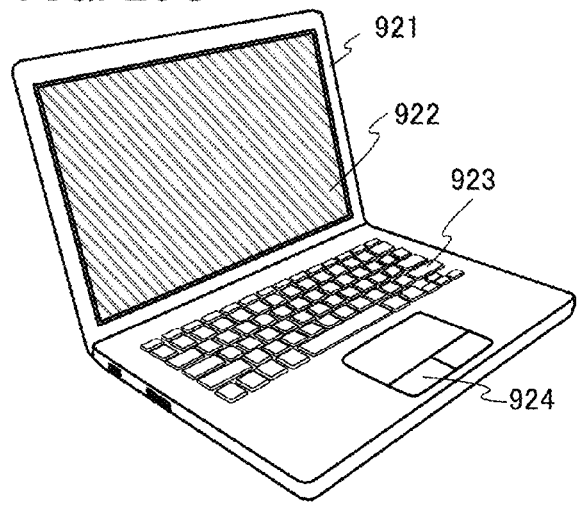

FIG. 23C illustrates a notebook personal computer, which includes a housing 921, a display portion 922, a keyboard 923, a pointing device 924, and the like.

Figure 23D:
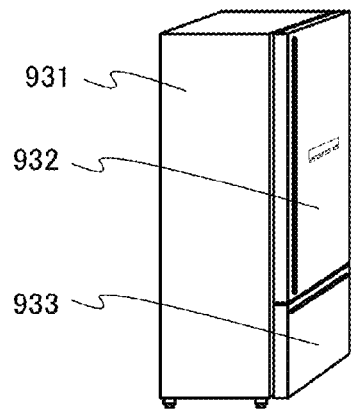

FIG. 23D illustrates an electric refrigerator-freezer, which includes a housing 931, a refrigerator door 932, a freezer door 933, and the like.

Figure 23E:
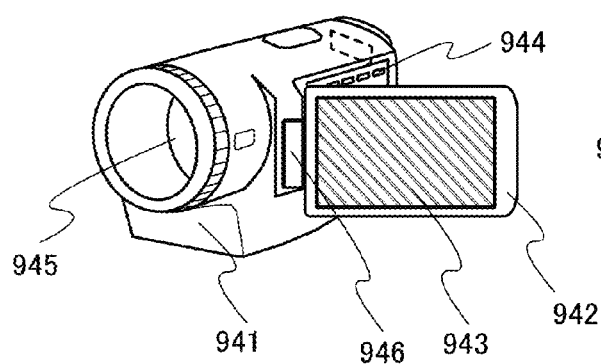

FIG. 23E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 23F:
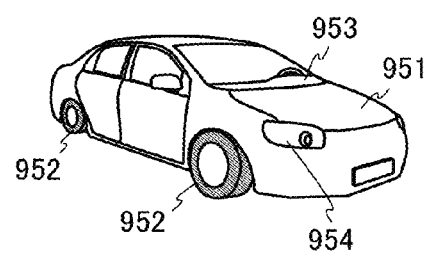
Figure 24A:
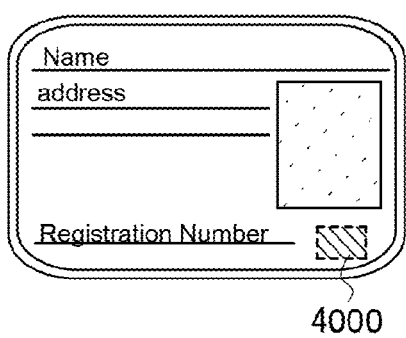
FIGS. 24A to 24F are perspective views illustrating application examples of an RF tag.
Figure 24B:
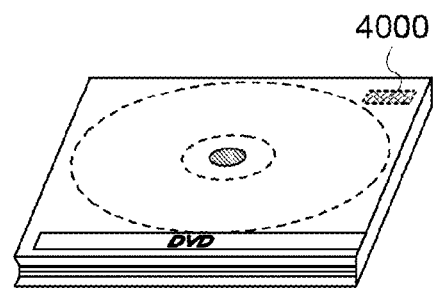
Figure 24C:
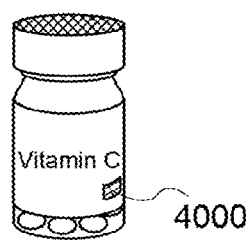
Figure 24D:
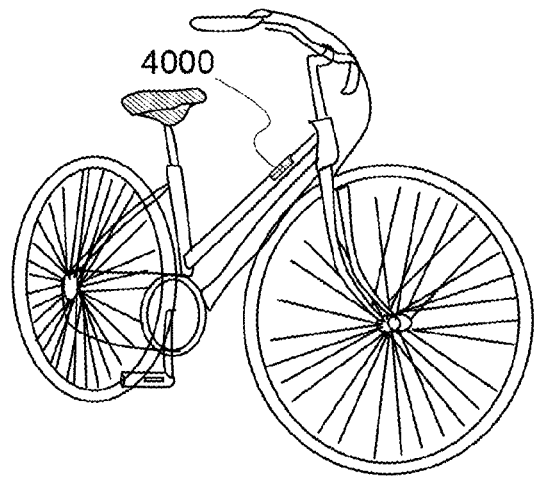
Figure 24E:
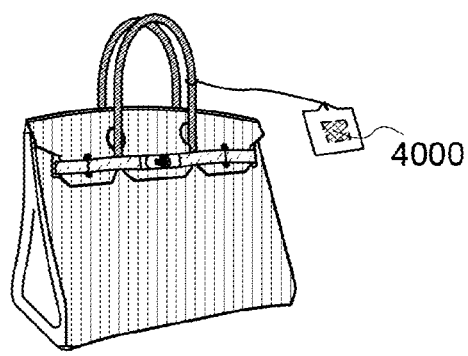
Figure 24F:
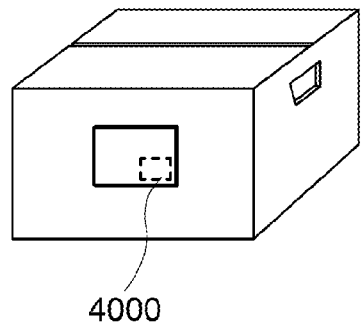

FIG. 23F illustrates a car, which includes a car body 951, wheels 952, a dashboard 953, lights 954, and the like.

Next, an application example of a display device that can include the semiconductor device or memory device of one embodiment of the present invention is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be used, for example.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescent (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on a current), a plasma display panel (PDP), an electron emitter, a display element using a carbon nanotube, a liquid crystal element, electronic ink, an electrowetting element, an electrophoretic element, a display element using micro electro mechanical systems (MEMS), (e.g., a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, or a piezoelectric ceramic display), quantum dots, and the like. Other than the above, a display medium whose contrast, luminance, reflectance, transmittance, or the like is changed by an electric or magnetic effect may be included. Examples of a display device using an EL element include an EL display. Examples of a display device using electron emitters include a field emission display (FED), and an SED-type flat panel display (SED: surface-conduction electron-emitter display). Examples of a display device using a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device using electronic ink, Electronic Liquid Powder (registered trademark), or electrophoretic elements include electronic paper. Examples of a display device using a quantum dot in each pixel include a quantum dot display. Note that the quantum dots may be provided in part of a backlight, instead of being used as a display element. With the use of the quantum dots, an image with high color purity can be displayed. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED chip, graphene or graphite may be provided under an electrode or a nitride semiconductor of the LED chip. Graphene or graphite may be a multilayer film in which a plurality of layers are stacked. The provision of graphene or graphite enables a nitride semiconductor such as an n-type GaN semiconductor layer including crystals to be easily formed thereover. Furthermore, a p-type GaN semiconductor layer including crystals, or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In a display device using MEMS, a dry agent may be provided in a space where a display element is sealed (or between an element substrate over which the display element is placed and a counter substrate opposed to the element substrate, for example). With the dry agent, malfunction or degradation of the MEMS or the like due to moisture can be prevented.

Note that this embodiment can be combined with any of the other embodiments in this specification as appropriate.

Embodiment 7

In this embodiment, application examples of an RF tag that can include the memory device of one embodiment of the present invention will be described with reference to FIGS. 24A to 24F. The RF tag is widely used and can be provided for, for example, products such as bills, coins, securities, bearer bonds, documents (e.g., driver's licenses or resident's cards, see FIG. 24A), recording media (e.g., DVD or video tapes, see FIG. 24B), packaging containers (e.g., wrapping paper or bottles, see FIG. 24C), vehicles (e.g., bicycles, see FIG. 24D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 24E and 24F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Note that this embodiment can be combined with any of the other embodiments in this specification as appropriate.

Embodiment 8

Described in this embodiment are structures of an oxide semiconductor film capable of being used for the OS transistors described in the above embodiments.

<<Structure of Oxide Semiconductor>>

Structures of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 25A:
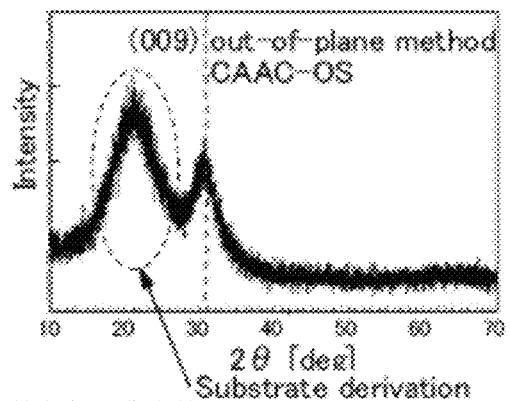
FIGS. 25A to 25E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle ($2\theta$) of around 31° as shown in FIG. 25A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a $2\theta$ of around 36° in addition to the peak at a $2\theta$ of around 31°. The peak at a $2\theta$ of around 36° is derived from a crystal structure that is classified into the space group Fd-3m; thus, this peak is preferably not exhibited in a CAAC-OS.

Figure 25B:
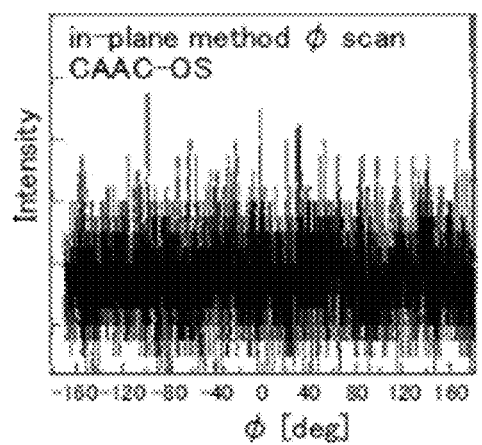
Figure 25C:
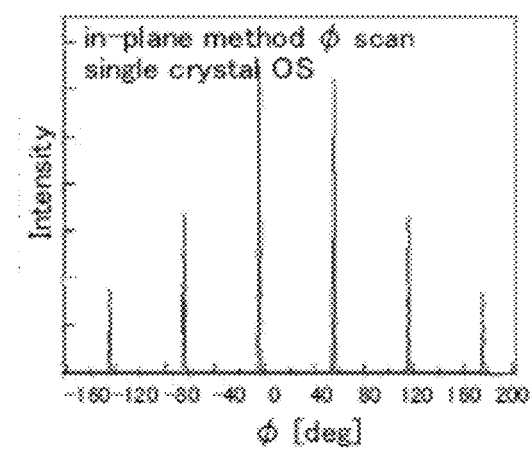

On the other hand, in structural analysis of the CAAC-OS by an in-plane method in which an X-ray is incident on the CAAC-OS in a direction parallel to the formation surface, a peak appears at a $2\theta$ of around 56°. This peak is attributed to the (110) plane of the $InGaZnO_4$ crystal. When analysis ($\phi$ scan) is performed with $2\theta$ fixed at around 56° and with the sample rotated using a normal vector to the sample surface as an axis ($\phi$ axis), as shown in FIG. 25B, a peak is not clearly observed. In contrast, in the case where single crystal $InGaZnO_4$ is subjected to $\phi$ scan with $2\theta$ fixed at around 56°, as shown in FIG. 25C, six peaks which are derived from crystal planes equivalent to the (110) plane are observed. Accordingly, the structural analysis using XRD shows that the directions of a-axes and b-axes are irregularly oriented in the CAAC-OS.

Figure 25D:
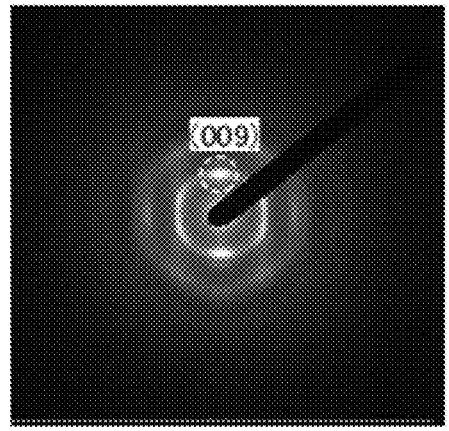
Figure 25E:
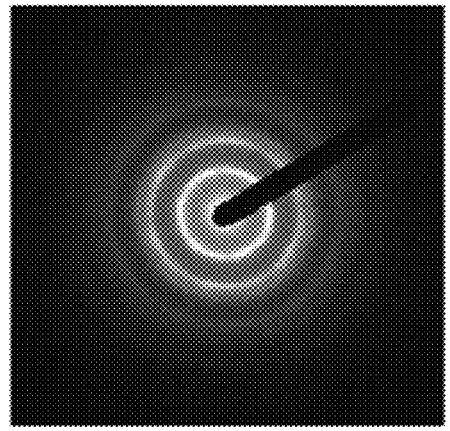

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 25D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 25E shows a diffraction pattern obtained in such a manner that an electron beam with a probe diameter of 300 nm is incident on the same sample in a direction perpendicular to the sample surface. As shown in FIG. 25E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 25E is considered to be derived from the (010) plane, the (100) plane, and the like of the $InGaZnO_4$ crystal. The second ring in FIG. 25E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 26A:
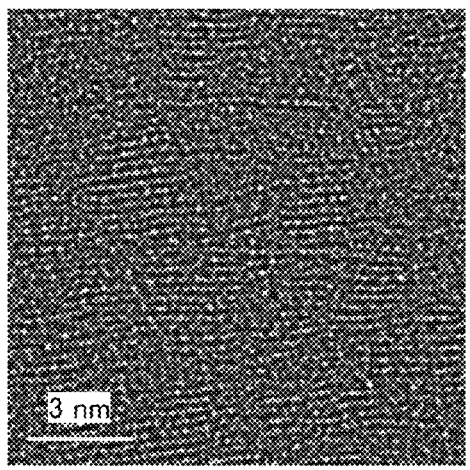
FIGS. 26A to 26E show a cross-sectional TEM image and plan-view TEM images of a CAAC-OS and images obtained through analysis thereof.

FIG. 26A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 26A shows pellets in which metal atoms are arranged in a layered manner. FIG. 26A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 26B:
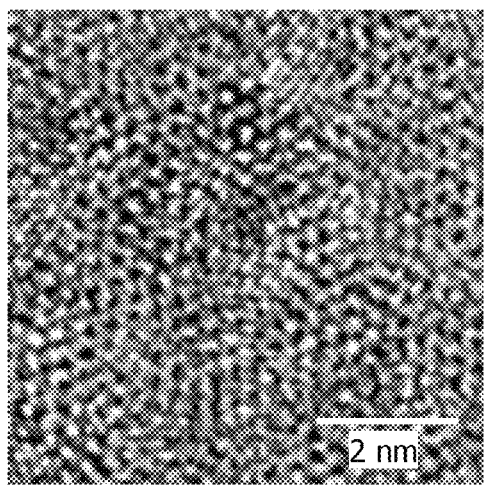
Figure 26C:
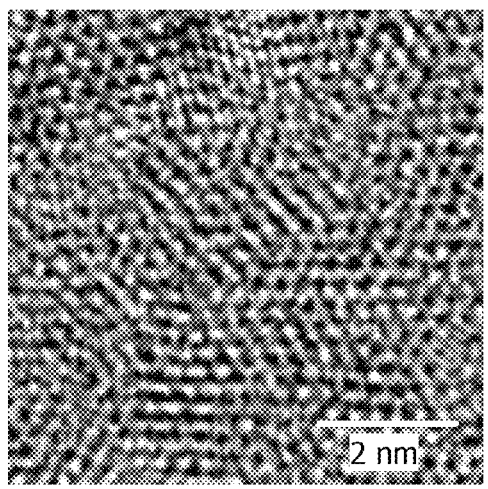
Figure 26D:
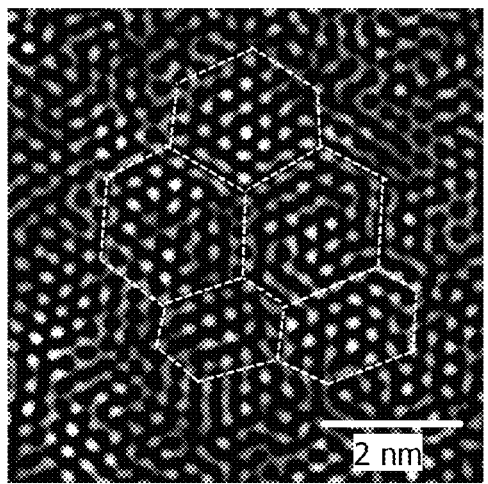
Figure 26E:
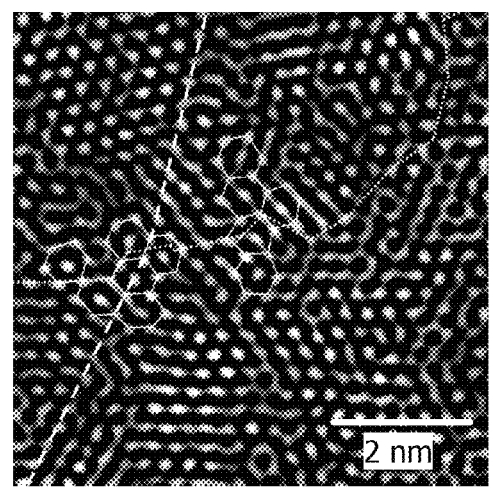

FIGS. 26B and 26C show Cs-corrected high-resolution TEM images of a plane of the CAAC-OS observed from a direction substantially perpendicular to the sample surface. FIGS. 26D and 26E are images obtained through image processing of FIGS. 26B and 26C. The method of image processing is as follows. The image in FIG. 26B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 26D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 26E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 27A:
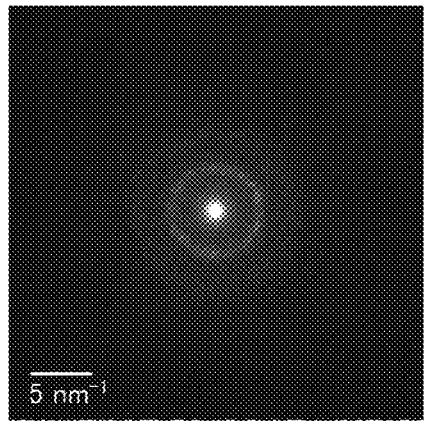
FIGS. 27A to 27D show electron diffraction patterns and a cross-sectional TEM image of an nc-OS.
Figure 27B:
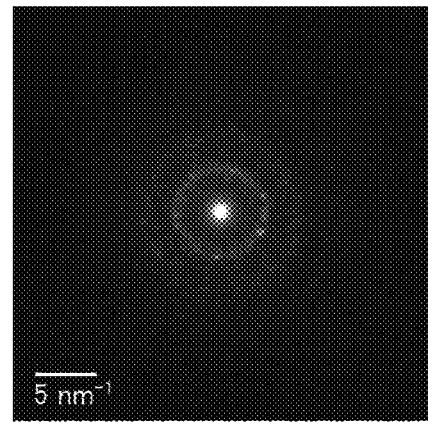

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 27A is observed. FIG. 27B shows a diffraction pattern obtained when an electron beam with a probe diameter of 1 nm is incident on the same sample. As shown in FIG. 27B, a plurality of spots are observed in a ring-like region. In other words, ordering in an nc-OS is not observed with an electron beam with a probe diameter of 50 nm but is observed with an electron beam with a probe diameter of 1 nm.

Figure 27C:
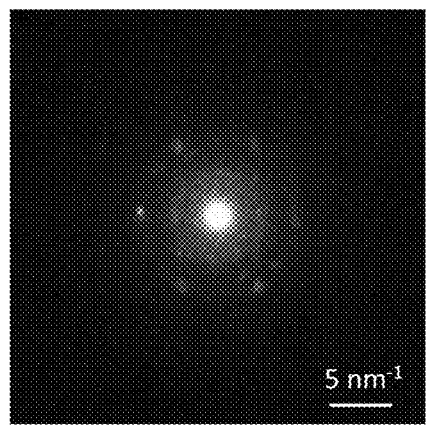

Furthermore, an electron diffraction pattern in which spots are arranged in an approximately hexagonal shape is observed in some cases as shown in FIG. 27C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 27D:
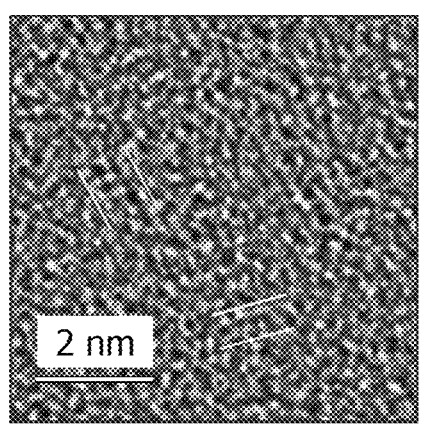

FIG. 27D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 27D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

Figure 28A:
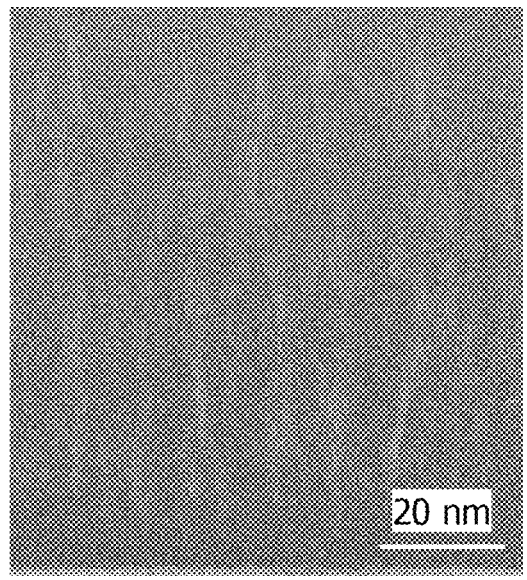
FIGS. 28A and 28B show cross-sectional TEM images of an a-like OS.
Figure 28B:
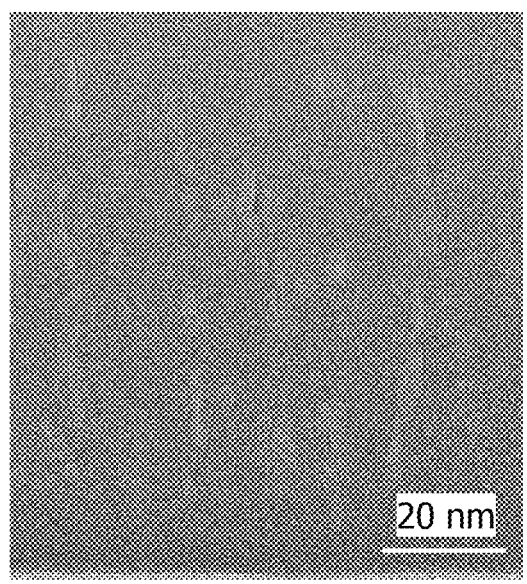

FIGS. 28A and 28B are high-resolution cross-sectional TEM images of an a-like OS. FIG. 28A is the high-resolution cross-sectional TEM image of the a-like OS at the start of the electron irradiation. FIG. 28B is the high-resolution cross-sectional TEM image of a-like OS after the electron (e⁻) irradiation at $4.3\times10^8$ e⁻/nm². FIGS. 28A and 28B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO₄ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO₄ in the following description. Each of lattice fringes corresponds to the a-b plane of the InGaZnO₄ crystal.

Figure 29:
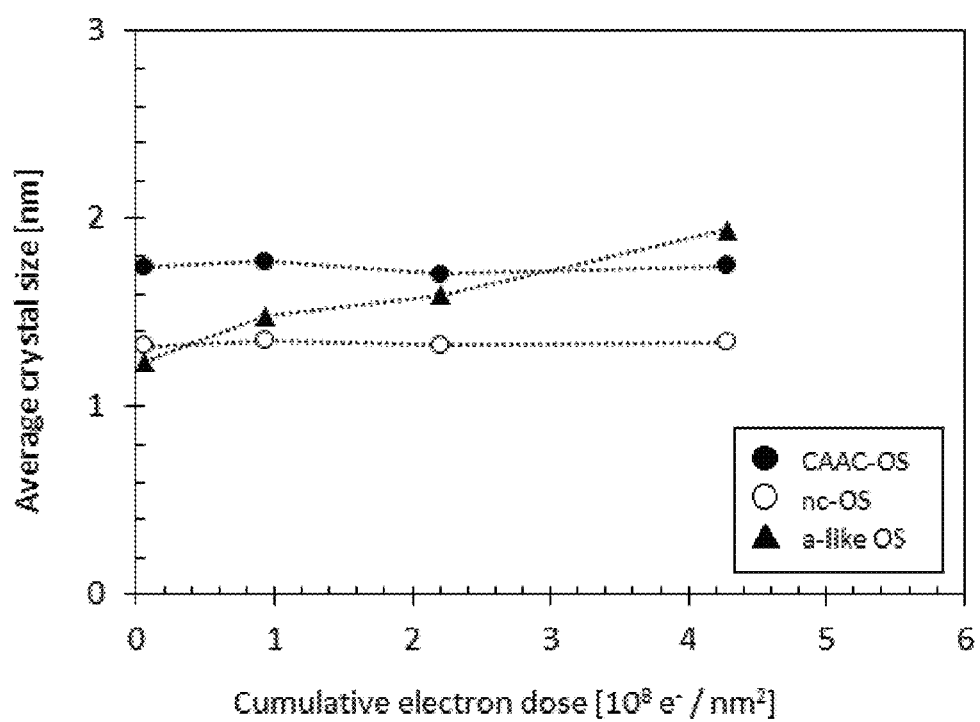
FIG. 29 shows a change in crystal part of an In—Ga—Zn oxide induced by electron irradiation.

FIG. 29 shows change in the average size of crystal parts (at 22 points to 30 points) in each sample. Note that the crystal part size corresponds to the length of a lattice fringe. FIG. 29 indicates that the crystal part size in the a-like OS increases with an increase in the cumulative electron dose. As shown in FIG. 29, a crystal part of approximately 1.2 nm (also referred to as an initial nucleus) at the start of TEM observation grows to a size of approximately 1.9 nm at a cumulative electron (e⁻) dose of $4.2\times10^8$ e⁻/nm². In contrast, the crystal part size in the nc-OS and the CAAC-OS shows little change from the start of electron irradiation to a cumulative electron dose of $4.2\times10^8$ e⁻/nm². As shown in FIG. 29, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7\times10^5$ e⁻/(nm²·S); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO₄ with a rhombohedral crystal structure is 6.357 g/cm³. Accordingly, in the case of the oxide semiconductor having an atomic ratio of In:Ga:Zn=1:1:1, the density of the a-like OS is higher than or equal to 5.0 g/cm³ and lower than 5.9 g/cm³. For example, in the case of the oxide semiconductor having an atomic ratio of In:Ga:Zn=1:1:1, the density of each of the nc-OS and the CAAC-OS is higher than or equal to 5.9 g/cm³ and lower than 6.3 g/cm³.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy ($V_O$) and impurities in the oxide semiconductor.

When the amount of oxygen vacancy in the oxide semiconductor increases, hydrogen is bonded to the oxygen vacancy (this state is also referred to as $V_OH$), increasing the density of defect states. The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the concentration of impurity in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified oxide semiconductor is lower than $8\times10^{15}$ cm⁻³, preferably lower than $1\times10^{11}$ cm⁻³, and further preferably lower than $1\times10^{10}$ cm⁻³ and higher than or equal to $1\times10^{-9}$ cm⁻³.

In contrast, the carrier density of the oxide semiconductor is preferably increased in order to increase the on-state current of the transistor or increase the field-effect mobility of the transistor. In order to increase the carrier density of the oxide semiconductor, the concentration of impurity or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where the on/off ratio is obtained in the Id-Vg characteristics of the transistor can be regarded as a substantially intrinsic semiconductor. Further, an oxide semiconductor that has a high electron affinity and thus has a narrow bandgap so as to increase the density of thermally excited electrons (carriers) can be regarded as a substantially intrinsic semiconductor. Note that a transistor using an oxide semiconductor with higher electron affinity has lower threshold voltage.

The aforementioned oxide semiconductor with an increased carrier density has somewhat n-type conductivity; thus, it can be referred to as a "Slightly-n" oxide semiconductor.

The carrier density of a substantially intrinsic oxide semiconductor is preferably higher than or equal to $1\times10^5$ $cm^{-3}$ and lower than $1\times10^{18}$ $cm^{-3}$, further preferably higher than or equal to $1\times10^7$ $cm^{-3}$ and lower than or equal to $1\times10^{17}$ $cm^{-3}$, still further preferably higher than or equal to $1\times10^9$ $cm^{-3}$ and lower than or equal to $5\times10^{16}$ $cm^{-3}$, yet further preferably higher than or equal to $1\times10^{10}$ $cm^{-3}$ and lower than or equal to $1\times10^{16}$ $cm^{-3}$, and yet still preferably higher than or equal to $1\times10^{11}$ $cm^{-3}$ and lower than or equal to $1\times10^{15}$ $cm^{-3}$.

Note that this embodiment can be combined with any of the other embodiments in this specification as appropriate.

Example 1

In this example, with use of a memory cell including a capacitor and a writing transistor, the threshold voltage of the transistor is calculated while the storage capacitance of the capacitor is varied. The results are shown below.

The memory cell has the same configuration as the memory cell 210 in FIG. 7. The capacitor MC1 has a storage capacitance of 20 fF, the wiring BL (also referred to as a bit line) has a parasitic capacitance $C_B$ of 140 fF, the wiring BL has a precharge voltage of 0 V, the buffer circuit 104 has a one-time amplification degree, and the transistor OSTR1 (also referred to as a writing transistor) has a writing voltage $V_{WB}$ of 2 V.

The calculation is performed while the storage capacitance of the capacitor MC1 is varied in the range of 80% to 120%. Specifically, a capacitor CND1 has a storage capacitance of 16 fF (80%), a capacitor CND2 has a storage capacitance of 18 fF (90%), a capacitor CND3 has a storage capacitance of 20 fF (100%), a capacitor CND4 has a storage capacitance of 22 fF (110%), and a capacitor CND5 has a storage capacitance of 24 fF (120%). All the capacitors CND1 to CND5 are subjected to the following calculations 1 to 3 with the threshold voltage $V_{th}$ of the writing transistor set to 0.3 V, 0.4 V, 0.5 V, 0.6 V, 0.7 V, 0.8 V, 0.9 V, and 1.0 V.

<<Calculation 1>>

Figure 30A:
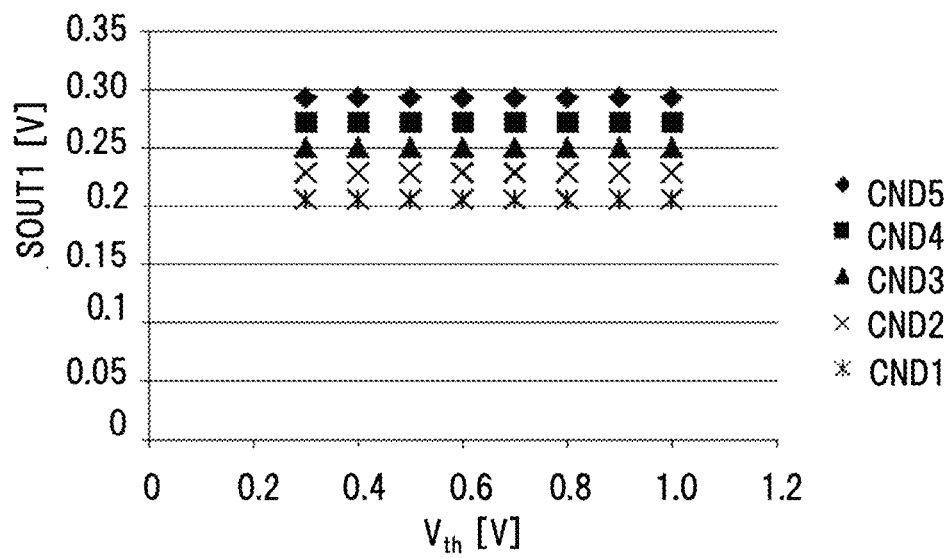
FIGS. 30A and 30B show calculated results using a test system of one embodiment of the present invention.

In addition to the above conditions, the potential $V_{GM1}$ applied to the gate of the writing transistor is set to 3.3 V. FIG. 30A shows the potentials of an output SOUT1 of a buffer circuit at the time of performing the writing and reading operations of Step S1 shown in Operation example of Embodiment 1. The results in FIG. 30A show that variations in the storage capacitance of the capacitor MC1 are output as differences in the output SOUT1 of the buffer circuit, and are not influenced by the threshold voltage $V_{th}$ of the writing transistor.

<<Calculation 2>>

Figure 30B:
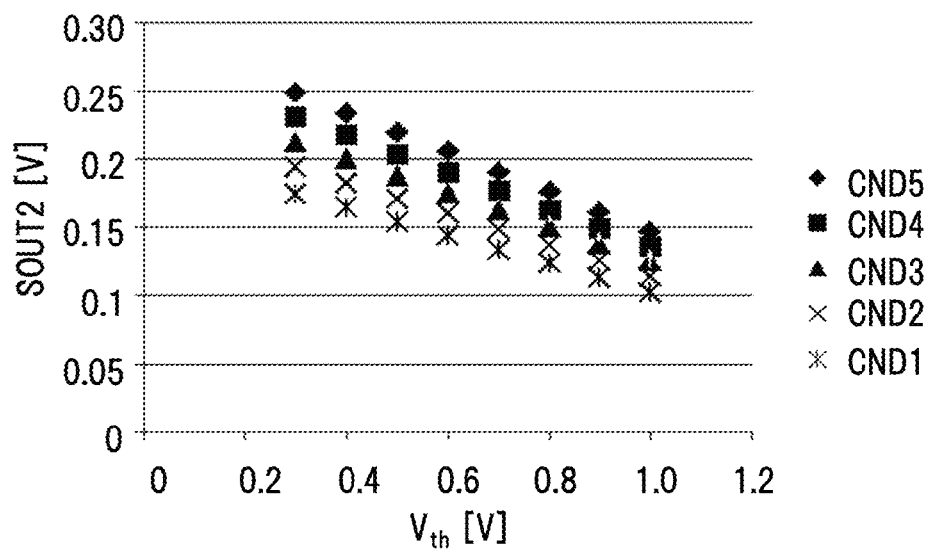

In addition to the above conditions, the potential $V_{GM1}$ applied to the gate of the writing transistor is set to 2.0 V. FIG. 30B shows the potentials of an output SOUT2 of the buffer circuit at the time of performing the writing and reading operations of Step S2 shown in Operation example of Embodiment 1. The results in FIG. 30B show that variations in the storage capacitance of the capacitor MC1 and differences in the threshold voltage $V_{th}$ of the writing transistor are output as differences in the output SOUT2 of the buffer circuit.

<<Calculation 3>>

Figure 31:
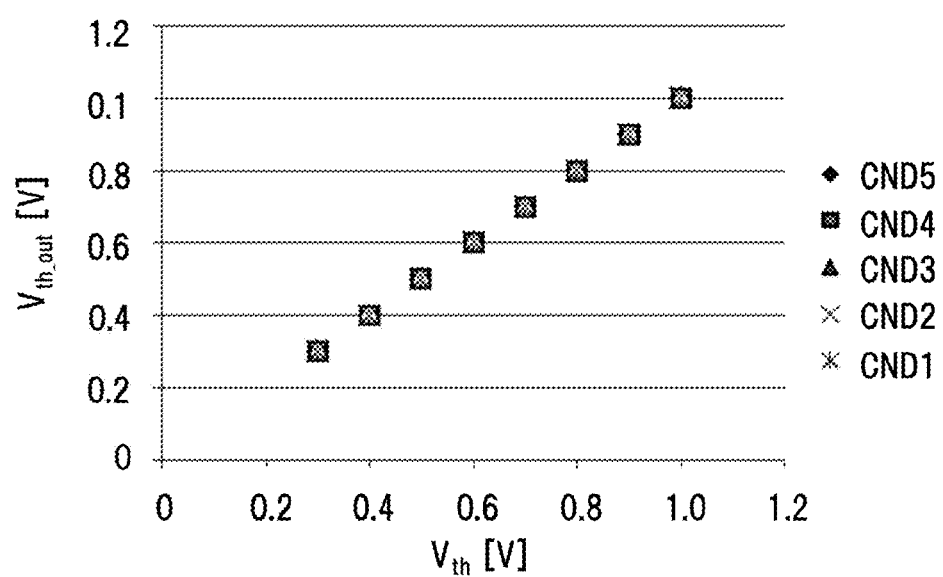
FIG. 31 shows calculated results using a test system of one embodiment of the present invention.

FIG. 31 shows the calculated results ($V_{th\_OUT}$) of the threshold voltage $V_{th}$ of the writing transistor, which were obtained by performing Step S3 shown in Operation example of Embodiment 1 with use of the writing voltage $V_{WB}$ and SOUT1 and SOUT2 obtained from Calculations 1 and 2. According to the results in FIG. 31, the predetermined threshold voltage $V_{th}$ and the calculated threshold voltage $V_{th\_OUT}$ were approximately equal to each other regardless of the variations in the storage capacitance of the capacitor MC1 and the parasitic capacitance $C_B$.

Calculations 1 to 3 allow the threshold voltage $V_{th}$ of the writing transistor to be correctly extracted without being influenced by the variations in the storage capacitance of the capacitor MC1 and the parasitic capacitance $C_B$ of the bit line. That is, the correct threshold voltage $V_{th}$ of the writing transistor can be extracted from all the memory cells by Steps S1 to S3, so that the semiconductor device or the memory device can be evaluated.

The memory cell used in this example is not limited to the memory cell 210, and the same calculations can be performed on any memory cell that controls charge and discharge of a storage node with a writing transistor. For example, the same calculations can be performed on the memory cells 220, 230, and 240 shown in FIGS. 8A to 8C.

Note that this example can be combined with any of the other embodiments in this specification as appropriate.

(Notes on the Description in this Specification and the Like)

"The following is" notes on the description of the above embodiments, structures in the embodiments, and the example.

<Notes on One Embodiment of the Present Invention Described in Embodiments and Example>

One embodiment of the present invention can be constituted by appropriately combining the structure described in an embodiment with any of the structures described in the other embodiments and Example. In addition, in the case where a plurality of structure examples are described in one embodiment or Example, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

<Notes on Ordinal Numbers>

In this specification and the like, ordinal numbers such as "first", "second", and "third" are used in order to avoid confusion among components. Thus, the terms do not limit the number or order of components. In the present specification and the like, a "first" component in one embodiment can be referred to as a "second" component in other embodiments or claims. Alternatively, in the present specification and the like, a "first" component in one embodiment can be referred to without the ordinal number in other embodiments or claims.

<Notes on the Description for Drawings>

Embodiments are described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the description of the embodiments. Note that in the structures of the invention described above, the same portions or portions having similar functions are denoted by the same reference numerals in different drawings, and the description of such portions is not repeated.

In this specification and the like, the terms for explaining arrangement, such as "over" and "under", are used for convenience to describe the positional relation between components with reference to drawings. The positional relation between components is changed as appropriate in accordance with a direction in which each component is described. Therefore, the terms for explaining arrangement are not limited to those used in this specification and may be changed to other terms as appropriate depending on the situation.

The term "over" or "under" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is associated with a plurality of functions or a case in which a plurality of circuits are associated with one function. Therefore, the segmentation of blocks in a block diagram is not limited by any of the components described in the specification and can be differently determined as appropriate depending on situations.

In the drawings, the size, the layer thickness, or the region is exaggerated for description convenience in some cases; therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In drawings such as a top view (also referred to as a plan view or a layout view) and a perspective view, some of components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of "electrodes" or "wirings" formed in an integrated manner.

In this specification and the like, voltage and potential can be replaced with each other. The voltage refers to a potential difference from a reference potential. When the reference potential is a ground potential, for example, a voltage can be replaced with a potential. The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases, or can be replaced with a word not including the term "film" or "layer". For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", and "power source line" can be interchanged with each other depending on the case or circumstances. For example, the term "wiring" can be changed into the term such as "signal line" or "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases.

<Notes on Definitions of Terms>

The following are definitions of the terms mentioned in the above embodiments.

<<Semiconductor>>

In this specification, a "semiconductor" includes characteristics of an "insulator" in some cases when the conductivity is sufficiently low, for example. Furthermore, it is difficult to strictly distinguish a "semiconductor" and an "insulator" from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor" includes characteristics of a "conductor" in some cases when the conductivity is sufficiently high, for example. Furthermore, it is difficult to strictly distinguish a "semiconductor" and a "conductor"

from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components; specific examples are hydrogen (also included in water), lithium, sodium, silicon, boron, phosphorus, carbon, and nitrogen. In the case of an oxide semiconductor, oxygen vacancy may be formed by entry of impurities such as hydrogen. Further, in the case where the semiconductor is a silicon layer, examples of an impurity which changes the characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor has a channel formation region between a drain (a drain terminal, a drain region, or a drain electrode) and a source (a source terminal, a source region, or a source electrode), and current can flow through the drain, the channel formation region, and the source. Note that in this specification and the like, a channel formation region refers to a region through which current mainly flows.

Furthermore, the functions of a source and a drain might be switched when transistors having different polarities are employed or a direction of current flow is changed in circuit operation, for example. Therefore, the terms "source" and "drain" can be switched in this specification and the like.

Unless otherwise specified, on-state current refers to drain current of a transistor in an on state. Unless otherwise specified, the on state of an n-channel transistor means that a voltage difference ($V_{gs}$) between its gate and source is larger than or equal to the threshold voltage ($V_{th}$), and the on state of a p-channel transistor means that $V_{gs}$ is smaller than or equal to $V_{th}$. For example, the on-state current of an n-channel transistor sometimes refers to a drain current that flows when $V_{gs}$ is larger than or equal to $V_{th}$. The on-state current of a transistor depends on a drain-source voltage ($V_{ds}$) in some cases.

Unless otherwise specified, off-state current refers to drain current of a transistor in an off state. Unless otherwise specified, the off state of an n-channel transistor means that $V_{gs}$ is smaller than $V_{th}$, and the off state of a p-channel transistor means that $V_{gs}$ is larger than $V_{th}$. For example, the off-state current of an n-channel transistor sometimes refers to a drain current that flows when $V_{gs}$ is smaller than $V_{th}$. The off-state current of a transistor depends on $V_{gs}$ in some cases. Thus, "the off-state current of a transistor is lower than $10^{-21}$ A" sometimes means that there is a $V_{gs}$ value at which the off-state current of a transistor is lower than $10^{-21}$ A.

The off-state current of a transistor depends on $V_{ds}$ in some cases. Unless otherwise specified, the off-state current in this specification sometimes refers to an off-state current at $V_{ds}$ with an absolute value of 0.1 V, 0.8 V, 1 V, 1.2 V, 1.8 V, 2.5 V, 3 V, 3.3 V, 10 V, 12 V, 16 V, or 20 V. In other cases, the off-state current of a transistor refers to an off-state current at $V_{ds}$ at which the reliability of a semiconductor device or the like including the transistor is ensured or $V_{ds}$ used in the semiconductor device or the like including the transistor.

Note that in this specification, a high power source voltage and a low power source voltage are sometimes referred to as an H level potential (or $V_{DD}$) and an L level potential (or GND), respectively.

<<Switch>>

In this specification and the like, a switch is in a conductive state (on state) or in a non-conductive state (off state) to determine whether current flows therethrough or not. Alternatively, a switch has a function of selecting and changing a current path.

Examples of the switch include an electrical switch and a mechanical switch. That is, the switch is not limited to a certain element and any element can be used as long as it can control current.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically cut off. In the case where a transistor operates just as a switch, the polarity (conductivity type) of the transistor is not particularly limited to a certain type.

An example of the mechanical switch is a switch formed using a micro electro mechanical system (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, the distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor.

Note that in one transistor, channel lengths in all regions do not necessarily have the same value. In other words, the channel length of one transistor is not fixed to one value in some cases. Therefore, in this specification, the channel length is any one of values, the maximum value, the minimum value, or the average value, in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

Note that in one transistor, channel widths in all regions do not necessarily have the same value. In other words, the channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where the electric field mobility, a current value per channel width, and the like of a transistor are obtained by calculation, a surrounded channel width may be used for the calculation. In that case, a value different from the one obtained by calculation using an effective channel width is obtained in some cases.

<<Connection>>

In this specification and the like, when it is described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X, Y, and the like each denote an object (e.g., a device, an element, a circuit, a wiring, an electrode, a terminal, a conductive film, or a layer).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that X and Y are electrically connected, the description is the same as the case where it is explicitly only described that X and Y are connected.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

<<Trigonal and Rhombohedral>>

In this specification, trigonal and rhombohedral crystal systems are included in a hexagonal crystal system.

This application is based on Japanese Patent Application serial No. 2015-068921 filed with Japan Patent Office on Mar. 30, 2015, the entire contents of which are hereby incorporated by reference.

What is claimed is:

1. A test method of a semiconductor device comprising a circuit,
    wherein the circuit comprises a first transistor, a capacitor, a retention node, and a first wiring,
    wherein one of a source and a drain of the first transistor is electrically connected to the first wiring,
    wherein the other of the source and the drain of the first transistor is electrically connected to the retention node, and
    wherein a first electrode of the capacitor is electrically connected to the retention node,
    the test method comprising:
        a first step of writing a first potential to the circuit by a first writing operation;
        a second step of performing a first reading operation on the circuit having undergone the first step, thereby obtaining a potential $V_{WBL1}$ of the first wiring;
        a third step of writing a second potential to the circuit by a second writing operation;
        a fourth step of performing a second reading operation on the circuit having undergone the third step, thereby obtaining a potential $V_{WBL2}$ of the first wiring; and
        a fifth step of calculating a threshold voltage $V_{th}$ of the first transistor,
    wherein the first writing operation comprises:
        a sixth step of supplying a potential $V_{WB}$ to the first wiring;
        a seventh step of supplying a potential $V_{GM1}$ to a gate of the first transistor after the sixth step, thereby establishing electrical continuity between the first wiring and the retention node; and
        an eighth step of turning off the first transistor after the seventh step, thereby bringing the retention node into an electrically floating state,
    wherein the second writing operation comprises:
        a ninth step of supplying the potential $V_{WB}$ to the first wiring;
        a tenth step of supplying a potential $V_{GM2}$ to the gate of the first transistor after the ninth step, thereby establishing electrical continuity between the first wiring and the retention node; and
        an eleventh step of turning off the first transistor after the tenth step, thereby bringing the retention node into an electrically floating state,
    wherein each of the first reading operation and the second reading operation comprises:
        a twelfth step of precharging the first wiring to a third potential;
        a thirteenth step of bringing the first wiring into an electrically floating state; and
        a fourteenth step of turning on the first transistor, thereby establishing electrical continuity between the first wiring and the retention node,
    wherein the potentials $V_{GM1}$ and $V_{GM2}$ satisfy the formula (a1), $V_{GM1} > V_{WB} + V_{th} > V_{GM2}$, and
    wherein the fifth step comprises a step of calculating the threshold voltage $V_{th}$ from the formula (a2), $V_{WBL2}/V_{WBL1} = (V_{WB} - V_{th})/V_{WB}$.

2. The test method according to claim 1, wherein the first transistor includes an oxide semiconductor in a channel formation region.

3. The test method according to claim 1,
    wherein the circuit includes a second transistor,
    wherein a gate of the second transistor is electrically connected to the retention node, and
    wherein one of a source and a drain of the second transistor is electrically connected to the first wiring.

4. The test method according to claim 1,
    wherein the circuit includes a second transistor and a second wiring,
    wherein a gate of the second transistor is electrically connected to the retention node, and
    wherein one of a source and a drain of the second transistor is electrically connected to the second wiring.

5. The test method according to claim 1,
    wherein the circuit includes a second transistor and a third transistor,
    wherein a gate of the second transistor is electrically connected to the retention node,
    wherein one of a source and a drain of the third transistor is electrically connected to one of a source and a drain of the second transistor, and
    wherein the other of the source and the drain of the third transistor is electrically connected to the first wiring.

6. The test method according to claim 1,
    wherein the circuit includes a second transistor, a third transistor, and a second wiring,
    wherein a gate of the second transistor is electrically connected to the retention node,
    wherein one of a source and a drain of the third transistor is electrically connected to one of a source and a drain of the second transistor, and
    wherein the other of the source and the drain of the third transistor is electrically connected to the second wiring.

7. The test method according to claim 4, wherein the second transistor includes single crystal silicon in a channel formation region.

8. The test method according to claim 6, wherein the second transistor and the third transistor each include single crystal silicon in a channel formation region.

\* \* \* \* \*